(12) United States Patent
Asami

(10) Patent No.: US 8,193,574 B2
(45) Date of Patent: Jun. 5, 2012

(54) NON-VOLATILE SEMICONDUCTOR MEMORY DEVICE

(75) Inventor: Yoshinobu Asami, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 354 days.

(21) Appl. No.: 12/434,390

(22) Filed: May 1, 2009

(65) Prior Publication Data

US 2009/0278188 A1    Nov. 12, 2009

(30) Foreign Application Priority Data

May 9, 2008   (JP) ................. 2008-123583

(51) Int. Cl.
 *H01L 29/788*  (2006.01)
(52) U.S. Cl. ........... 257/316; 257/66; 257/314; 257/315
(58) Field of Classification Search .................. 257/314, 257/315, 316, 66; 365/185.14; 438/164
See application file for complete search history.

(56) References Cited

U.S. PATENT DOCUMENTS

| | | | |
|---|---|---|---|
| 4,453,234 A | | 6/1984 | Uchida |
| 5,336,913 A | * | 8/1994 | Kakiuchi et al. ............. 257/321 |
| 5,886,376 A | | 3/1999 | Acovic et al. |
| 5,888,868 A | | 3/1999 | Yamazaki et al. |
| 5,960,265 A | | 9/1999 | Acovic et al. |
| 6,005,270 A | | 12/1999 | Noguchi |
| 6,498,369 B1 | | 12/2002 | Yamazaki et al. |
| 6,556,475 B2 | | 4/2003 | Yamazaki et al. |
| 6,646,922 B2 | | 11/2003 | Kato |
| 2002/0008273 A1 | | 1/2002 | Kumazaki |
| 2003/0047747 A1 | | 3/2003 | Kumazaki |
| 2003/0052363 A1 | | 3/2003 | Kumazaki |
| 2004/0113197 A1 | | 6/2004 | Yoshida et al. |
| 2005/0077580 A1 | | 4/2005 | Kumazaki |

(Continued)

FOREIGN PATENT DOCUMENTS

EP    1 837 900 A2    9/2007

(Continued)

OTHER PUBLICATIONS

International Search Report (Application No. PCT/JP2009/058594) dated Aug. 11, 2009.

(Continued)

*Primary Examiner* — Zandra Smith
*Assistant Examiner* — Errol Fernandes
(74) *Attorney, Agent, or Firm* — Nixon Peabody LLP; Jeffrey L. Costellia

(57) ABSTRACT

To reduce the writing and erasing voltages of a memory transistor without increasing the area of a memory cell, and to reduce the area of a memory cell without increasing the writing and erasing voltages. The memory cell includes a memory transistor having a first island-shaped semiconductor region, a floating gate and a control gate. In addition, a second island-shaped semiconductor region is formed under the floating gate with an insulating film interposed therebetween. Since the second island-shaped semiconductor region is electrically connected to the control gate, a capacitance is formed between the second island-shaped semiconductor region and the floating gate. This capacitance contributes to an increase in the coupling ratio of the memory transistor, which makes it possible to increase the coupling ratio without increasing the area of the memory cell. Furthermore, the area of the memory cell can be reduced without reducing the coupling ratio.

12 Claims, 16 Drawing Sheets

U.S. PATENT DOCUMENTS

| | | |
|---|---|---|
| 2005/0258473 A1 | 11/2005 | Yoshida et al. |
| 2005/0277253 A1 | 12/2005 | Kato et al. |
| 2006/0151827 A1 | 7/2006 | Kumazaki |
| 2007/0029605 A1 | 2/2007 | Kumazaki |
| 2007/0221971 A1 | 9/2007 | Yamazaki et al. |
| 2007/0228452 A1 | 10/2007 | Asami |
| 2007/0235794 A1 | 10/2007 | Yamazaik et al. |
| 2008/0049500 A1 | 2/2008 | Kato et al. |
| 2009/0283812 A1 | 11/2009 | Asami |

FOREIGN PATENT DOCUMENTS

| | | |
|---|---|---|
| JP | 07-130893 | 5/1995 |
| JP | 2006-013534 | 1/2006 |
| JP | 2007-288176 | 11/2007 |

OTHER PUBLICATIONS

Written Opinion (Application No. PCT/JP2009/058594) dated Aug. 11, 2009.

* cited by examiner

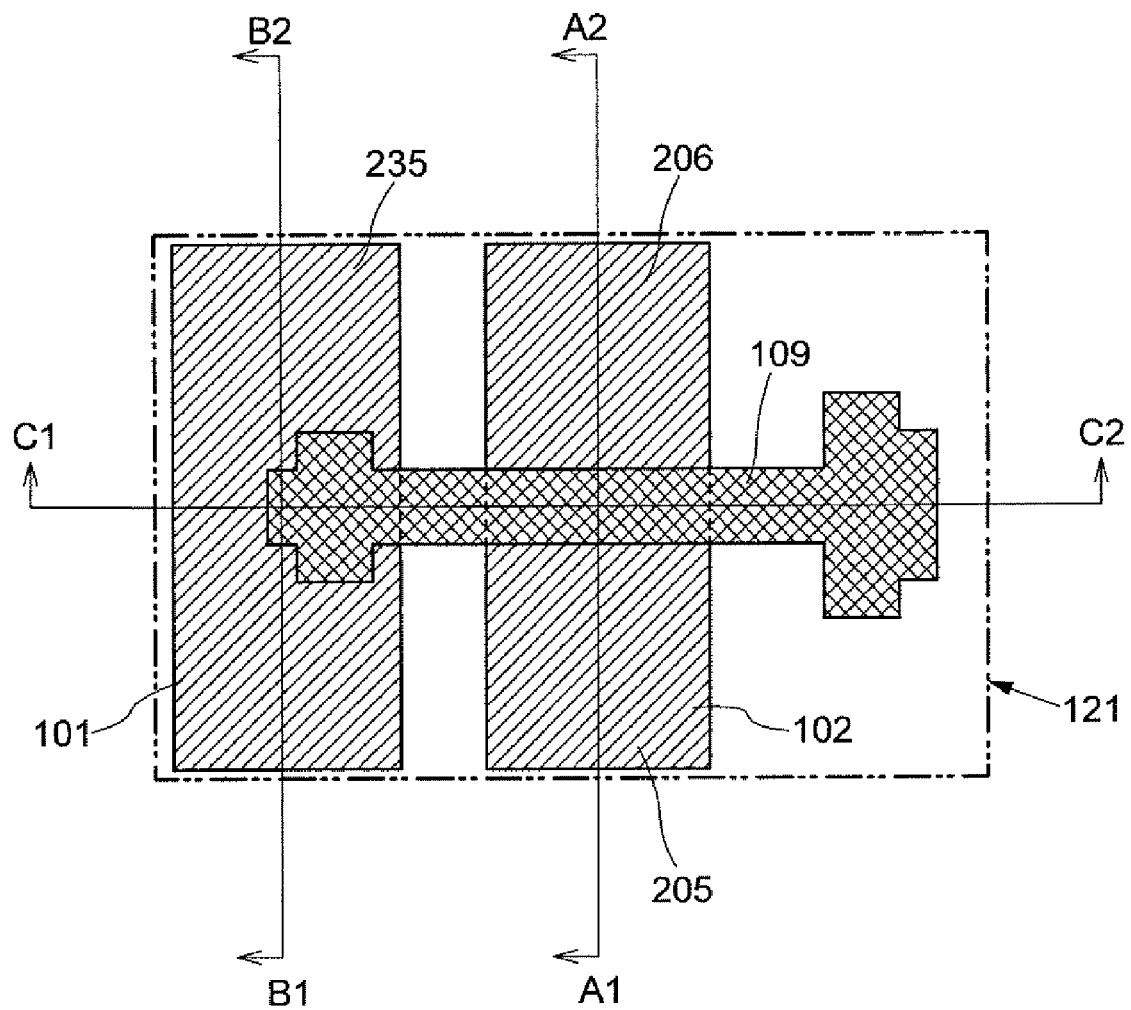

NON-VOLATILE SEMICONDUCTOR MEMORY DEVICE

TECHNICAL FIELD

The present invention relates to a non-volatile semiconductor memory device in which data can be written, read and erased.

BACKGROUND ART

As non-volatile semiconductor memory devices, an EEPROM (electrically erasable and programmable read only memory), a flash memory and the like are known. These non-volatile semiconductor memory devices are utilized as recording media of various products such as digital still cameras, portable audio players and cellular phones. Research and development of the non-volatile semiconductor memory devices have been actively conducted to meet the needs of the market, for example, further reduction in the size of the product, increase in memory capacity, increase in the speed of writing and reading data, and reduction in power consumption.

As one of the ways to meet the aforementioned needs of the market, in recent years, a non-volatile semiconductor memory device of a so-called SOI (silicon on insulator) type has been actively developed, in which elements are formed on a silicon film that is provided over a substrate with an insulating film interposed therebetween.

For example, Patent Document 1 discloses a non-volatile memory transistor having an SOI structure, which has been made to reduce cost and the operating voltage such as an erasing voltage. In Patent Document 1, a glass substrate or a plastic substrate is used as a substrate to reduce cost. A non-volatile memory transistor having an SOI structure, which is formed over a glass substrate, is disclosed in, for example, Patent Document 2 that is a patent application of which one of the inventors is the inventor of the present invention.

[Patent Document 1] Japanese Published Patent Application No. 2006-013534

[Patent Document 2] Japanese Published Patent Application No. 2007-288176

In the non-volatile memory elements having an SOI structure as disclosed in Patent Documents 1 and 2, however, it is very difficult to reduce a writing voltage and an erasing voltage without increasing the area of a memory cell. The reason for that will be explained below. Here, the case of using a non-volatile memory transistor (hereinafter, also abbreviated to a memory transistor) as a non-volatile memory element will be made described. First, the structure of a memory cell will be described and then, the method for writing, reading and erasing data will be described.

The structure of a memory cell will be described below with reference to FIG. 15 and FIGS. 16A and 16B. FIG. 15 is a plan view illustrating an example of a structure of a conventional memory cell, and FIGS. 16A and 16B are cross-sectional views taken along lines A1-A2 and B1-B2 of FIG. 15, respectively.

In the memory cell, one memory transistor is provided as a memory element, and the memory transistor is electrically connected to a source line (SL), a bit line (BL) and a word line (WL).

As illustrated in FIGS. 16A and 16B, an insulating film 1130 is formed over a substrate 1100, and an island-shaped semiconductor region 1102 is provided over the insulating film 1130. The island-shaped semiconductor region 1102 includes first impurity regions 1103 and 1104 doped with an n-type or p-type impurity element, second impurity regions 1105 and 1106 doped with an n-type or p-type impurity element, and a channel formation region 1107 interposed between the second impurity regions 1105 and 1106. The second impurity regions 1105 and 1106 may be formed as LDD (lightly doped drain) regions having an impurity concentration lower than that of the first impurity regions 1103 and 1104; may have an impurity concentration substantially equal to that of the first impurity regions 1103 and 1104; or may have an impurity concentration substantially equal to that of the channel formation region 1107 without being doped with an impurity element. The second impurity regions 1105 and 1106 may be formed in accordance with the characteristics of the memory element.

An insulating film 1108 is provided over the island-shaped semiconductor region 1102. A conductive film 1109 is provided over the insulating film 1108 so as to overlap the island-shaped semiconductor film 1102. The conductive film 1109 forms a floating gate (FG) of the memory transistor. An insulating film 1110 is provided over the conductive film 1109. A conductive film 1111 is provided over the insulating film 1110 so as to overlap the island-shaped semiconductor region 1102. The conductive film 1111 forms a control gate (CG) of the memory transistor and the word line electrically connected to the control gate. By forming both the control gate and the word line using the conductive film 1111, the control gate and the word line are electrically connected to each other.

An insulating film 1112 is provided over the conductive film 1111, and conductive films 1113 and 1114 are formed over the insulating film 1112. The conductive film 1113 forms a source line (SL) electrically connected to the memory transistor, and the conductive film 1114 forms a bit line (BL) electrically connected to the memory transistor. Through openings 1119 and 1120 formed in the insulating film 1112, the conductive films 1113 and 1114 are electrically connected to the first impurity regions 1103 and 1104, respectively. A region 1121 surrounded by an alternate long and two short dashes line of FIG. 15 is a region occupied by one memory cell.

The non-volatile memory transistor using a floating gate is a memory element in which data is stored in accordance with the amount of charge accumulated in the floating gate. Data is written or erased by controlling the amount of charge, and data is read by detecting the amount of charge. The method for writing, reading and erasing data will be described below.

In the memory transistor of FIG. 15, the floating gate (the conductive film 1109) is in an electrically floating state. Accordingly, the memory transistor functions as a transistor when a voltage is indirectly applied between the island-shaped semiconductor region 1102 and the floating gate from the control gate (the conductive film 1111). When electrons are accumulated in the floating gate, the voltage that has been applied to the control gate is less likely to be applied between the island-shaped semiconductor region 1102 and the floating gate than that when electrons are not accumulated; therefore, the threshold voltage of the memory transistor shifts to the positive direction. Thus, the data stored in the memory transistor can be read by detecting a change in the threshold voltage of the memory transistor. If the first impurity region 1103 and the first impurity region 1104 have the same potential, the relationship between the amount of charge accumulated in the floating gate and the threshold voltage can be represented by the following formulas (1) and (2).

$$V_{FG} = \frac{C_2}{C_1 + C_2}(V_{CG} - \Delta Vtm) \quad (1)$$

$$\Delta Vtm = -\frac{Q_{FG}}{C_2} \quad (2)$$

In the formulas (1) and (2), $V_{FG}$ is the potential of the floating gate; $V_{CG}$, the potential of the control gate; $C_1$, the capacitance between the island-shaped semiconductor region and the floating gate; $C_2$, the capacitance between the floating gate and the control gate; $Q_{FG}$, the amount of charge in the floating gate; and $\Delta Vtm$, a change in the threshold voltage of the memory transistor. Note that $C_2/(C_1+C_2)$ in the formula (1) is generally referred to as a coupling ratio. As shown in the formula (1), as the coupling ratio increases, the ratio of the voltage applied between the island-shaped semiconductor region 1102 and the floating gate to the potential $V_{CG}$ of the control gate increases.

When data is to be written to the memory transistor, a high voltage (e.g., a positive high voltage) is applied to the control gate so that a voltage is indirectly applied between the island-shaped semiconductor region 1102 and the floating gate. Then, electrons are injected into the floating gate by an F-N (Fowler-Nordheim) tunneling current or thermal electrons. When data is to be erased from the memory transistor, a high voltage (e.g., a negative high voltage) is applied to the control gate so that a voltage is indirectly applied between the island-shaped semiconductor region 1102 and the floating gates whereby electrons are withdrawn from the floating gate.

Thus, the voltage applied to the control gate can be efficiently applied between the island-shaped semiconductor region 1102 and the floating gate by increasing the coupling ratio, so that a writing voltage and an erasing voltage can be reduced. In other words, the coupling ratio significantly influences the writing voltage and the erasing voltage.

The relationship between the area of the memory cell and the writing and erasing voltages as well as the relationship between the area of the memory cell and the coupling ratio will be described below.

As shown in the formula (1), in order to increase the coupling ratio, it is effective to increase the capacitance $C_2$ between the floating gate and the control gate. The capacitance $C_2$ can be increased by either reducing the thickness of the insulating film 1110 or increasing the area where the floating gate and the control gate overlap each other in the plan view (layout) of FIG. 15.

However, the minimum thickness of the insulating film 1110 is automatically decided based on the aforementioned operating principle of the memory transistor, and there is a limitation on reduction in the thickness of the insulating film 1110. This is because it is difficult for the memory transistor using a floating gate to retain the stored data if the charge accumulated in the floating gate is easily leaked. Thus, the thickness of the insulating film 1110 cannot be smaller than a predetermined thickness. For a similar reason, the thickness of the insulating film 1108 cannot be smaller than a predetermined thickness. The thickness of the insulating film 1108 is preferably about 8 nm to 10 nm, and the thickness of the insulating film 1110 is preferably about 10 nm to 20 nm.

Since the insulating film 1110 is provided over the floating gate while the insulating film 1108 is provided over the island-shaped semiconductor region 1102, the insulating film 1110 is less reliable as an insulating film than the insulating film 1108. Accordingly, it is generally said that the thickness of the insulating film 1110 needs to be larger than that of the insulating film 1108 to prevent the leakage of charge from the floating gate. In addition, in the case where the insulating film 1110 is too thin when the coupling ratio is low, electrons to be accumulated in the floating gate tunnel through the insulating film 1110 and escape to the control gate in writing. Accordingly, data cannot be written or erased, which may cause improper function as a memory element. Furthermore, in the case where functional circuits other than the memory cell are formed over the same substrate 1100, the thickness of the insulating film 1110 cannot be sufficiently reduced in some cases depending on the manufacturing process of transistors forming the functional circuits.

Thus, increasing the area of a region where the floating gate and the control gate overlap in the plan view of FIG. 15 is an easy method to increase the coupling ratio because the operation of the memory transistor is not particularly damaged. However, increasing this area is disadvantageous in that the area of the memory cell required for the memory element increases to reduce the integration of memory cells, leading to a higher bit cost of the non-volatile semiconductor memory device.

Furthermore, when the area of the memory cell is reduced in the plan view of FIG. 15, the area where the floating gate and the control gate overlap each other is also reduced, which leads to a lower coupling ratio and higher writing and erasing voltages.

DISCLOSURE OF INVENTION

In view of the foregoing problems, an object of one embodiment of the present invention is to provide a non-volatile semiconductor memory device in which a writing voltage and an erasing voltage can be reduced without increasing the area of a memory cell.

Another object of one embodiment of the present invention is to provide a non-volatile semiconductor memory device in which the area of a memory cell can be reduced without increasing a writing voltage and an erasing voltage.

One embodiment of the present invention can be applied to an EEPROM (electrically erasable and programmable read only memory), a flash memory and the like.

A non-volatile semiconductor memory device of one embodiment of the present invention includes a plurality of memory cells, each of which includes: a first island-shaped semiconductor region formed on an insulating surface and having a channel formation region and a pair of impurity regions serving as a source region or a drain region; a second island-shaped semiconductor region formed on the insulating surface; a floating gate overlapping the first island-shaped semiconductor region and the second island-shaped semiconductor region; a control gate overlapping the floating gate and electrically connected to the second island-shaped semiconductor region; a first insulating film formed between the first and second island-shaped semiconductor regions and the floating gate; and a second insulating film formed between the floating gate and the control gate.

In the aforementioned embodiment, the thickness of a part of the first insulating film, which overlaps the first island-shaped semiconductor region, can be selectively reduced. In addition, the thickness of a part of the first insulating film, which overlaps the second island-shaped semiconductor region, can also be selectively reduced. Such a first insulating film that is selectively reduced in thickness can be obtained by, for example, forming an insulating film having an opening at a portion to be reduced in thickness and then forming another insulating film over the insulating film.

In the aforementioned embodiment, a conductive film electrically connected to the control gate may be provided instead of the second island-shaped semiconductor region.

In the non-volatile semiconductor memory device of one embodiment of the present invention, the island-shaped semiconductor region or the conductive film, which is electrically connected to the control gate, is provided under the floating gate with the insulating film interposed therebetween. Accordingly, a capacitance is added between the island-shaped semiconductor region or the conductive film, and the floating gate.

Thus, according to one embodiment of the present invention, the coupling ratio can be increased without increasing the area of the memory cell. That is, according to one embodiment of the present invention, a writing voltage and an erasing voltage can be reduced without increasing the area of the memory cell; therefore, the present invention is effective in reducing the power consumption of the non-volatile semiconductor memory device.

Furthermore, according to one embodiment of the present invention, the area of the memory cell can be reduced without reducing the coupling ratio. That is, according to one embodiment of the present invention, the area of the memory cell can be reduced without increasing a writing voltage and an erasing voltage; therefore, one embodiment of the present invention is effective for higher integration of memory cells.

BRIEF DESCRIPTION OF DRAWINGS

In the accompanying drawings:

FIG. 5 is a plan view illustrating a method for manufacturing a non-volatile semiconductor memory device in accordance with one embodiment of the present invention;

BEST MODE FOR CARRYING OUT THE INVENTION

Figure 1:
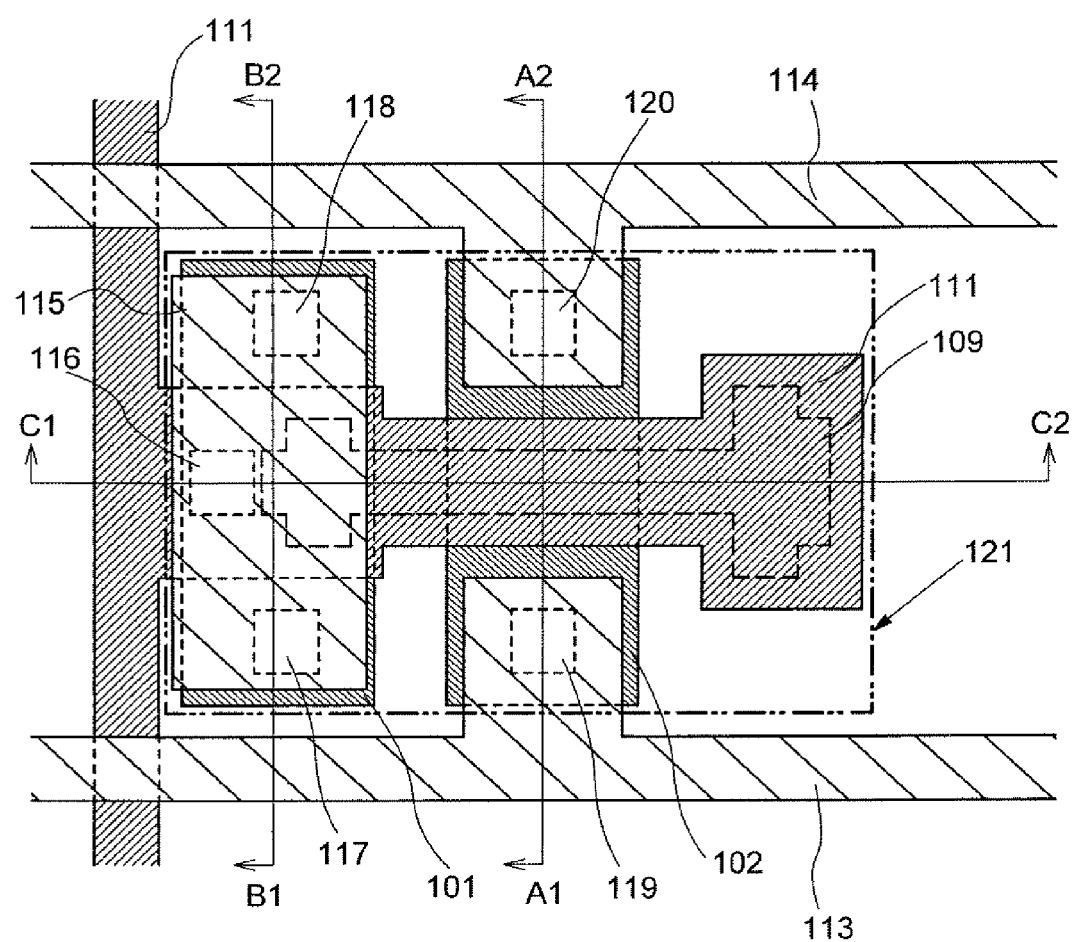
FIG. 1 is a plan view illustrating an example of a structure of a memory cell of a non-volatile semiconductor memory device in accordance with one embodiment of the present invention.

Embodiments of the present invention will be described below with reference to the drawings. Note that the present invention is not limited to the description given below, and it is easily understood by those skilled in the art that modes and details can be modified in various ways without departing from the spirit and scope of the present invention. Accordingly, the present invention should not be construed as being limited to the description of the embodiments given below. Note that in the drawings for explaining the embodiments, like portions are denoted by like reference numerals.

Embodiment 1

A non-volatile semiconductor memory device of this embodiment includes a plurality of memory cells (basic units for storing data) arranged in matrix, a plurality of source lines, a plurality of bit lines and a plurality of word lines. Each of the memory cells includes a memory element electrically connected to one of the source lines, one of the bit lines and one of the word lines. In this embodiment, a memory transistor is used as the memory element.

Figure 2A:
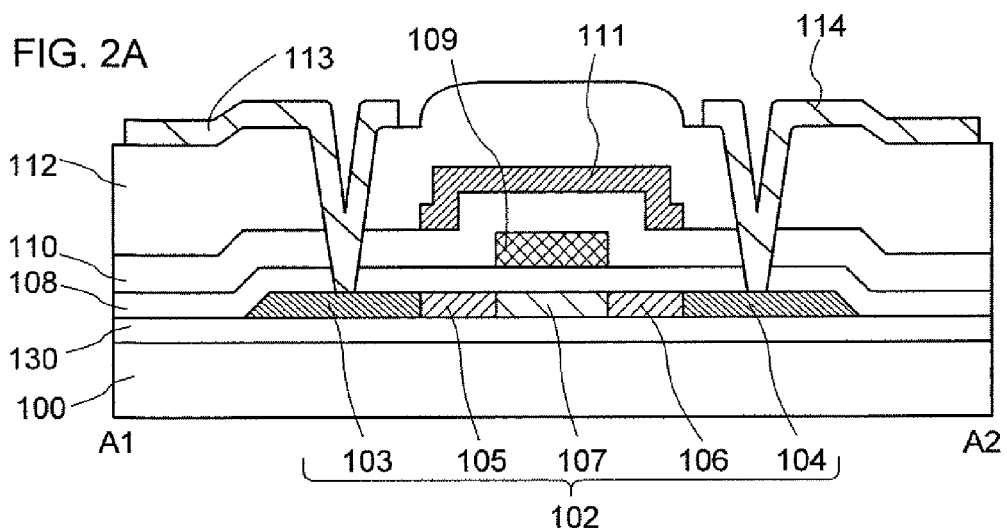
FIGS. 2A to 2C are cross-sectional views taken along lines A1-A2, B1-B2 and C1-C2 of FIG. 1, respectively.
Figure 2B:
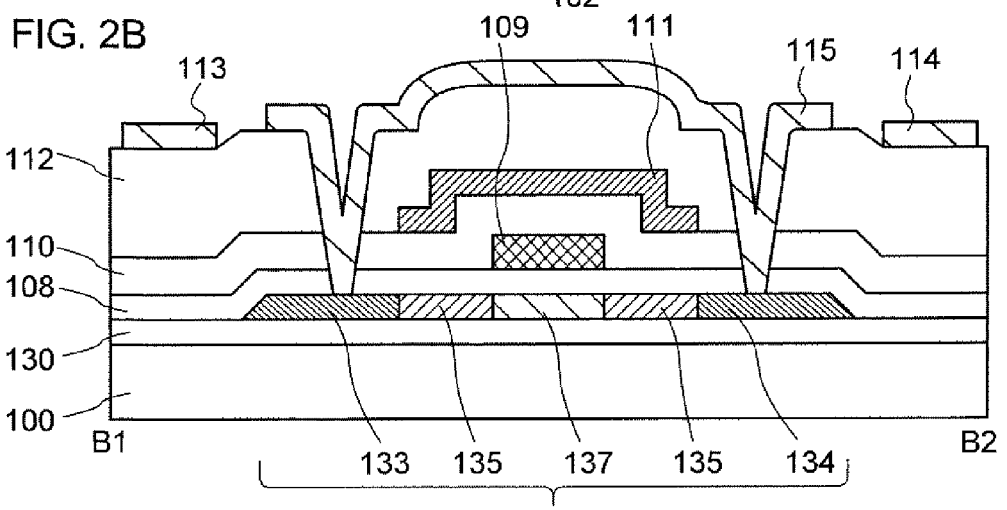
Figure 2C:
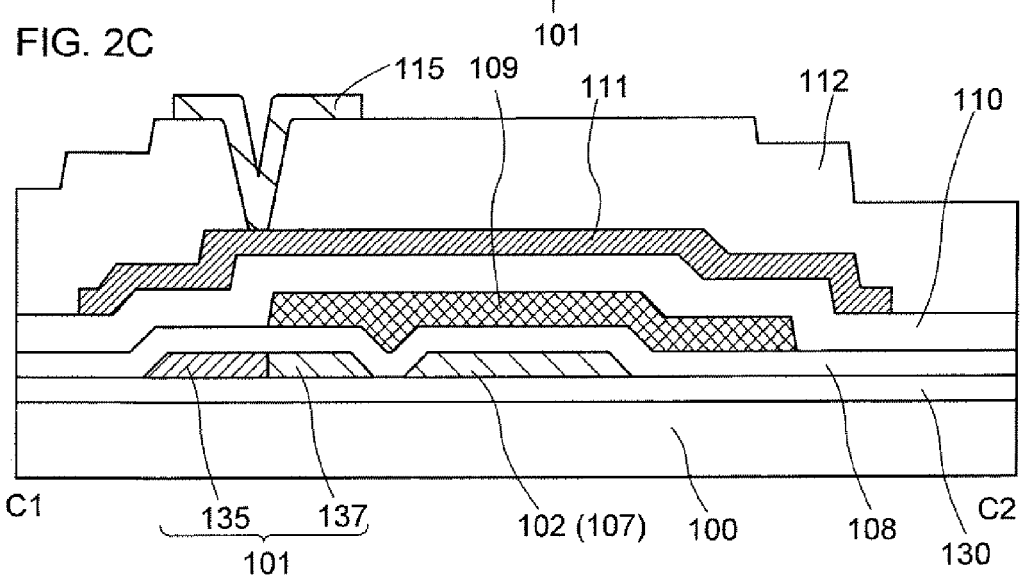
Figure 3:
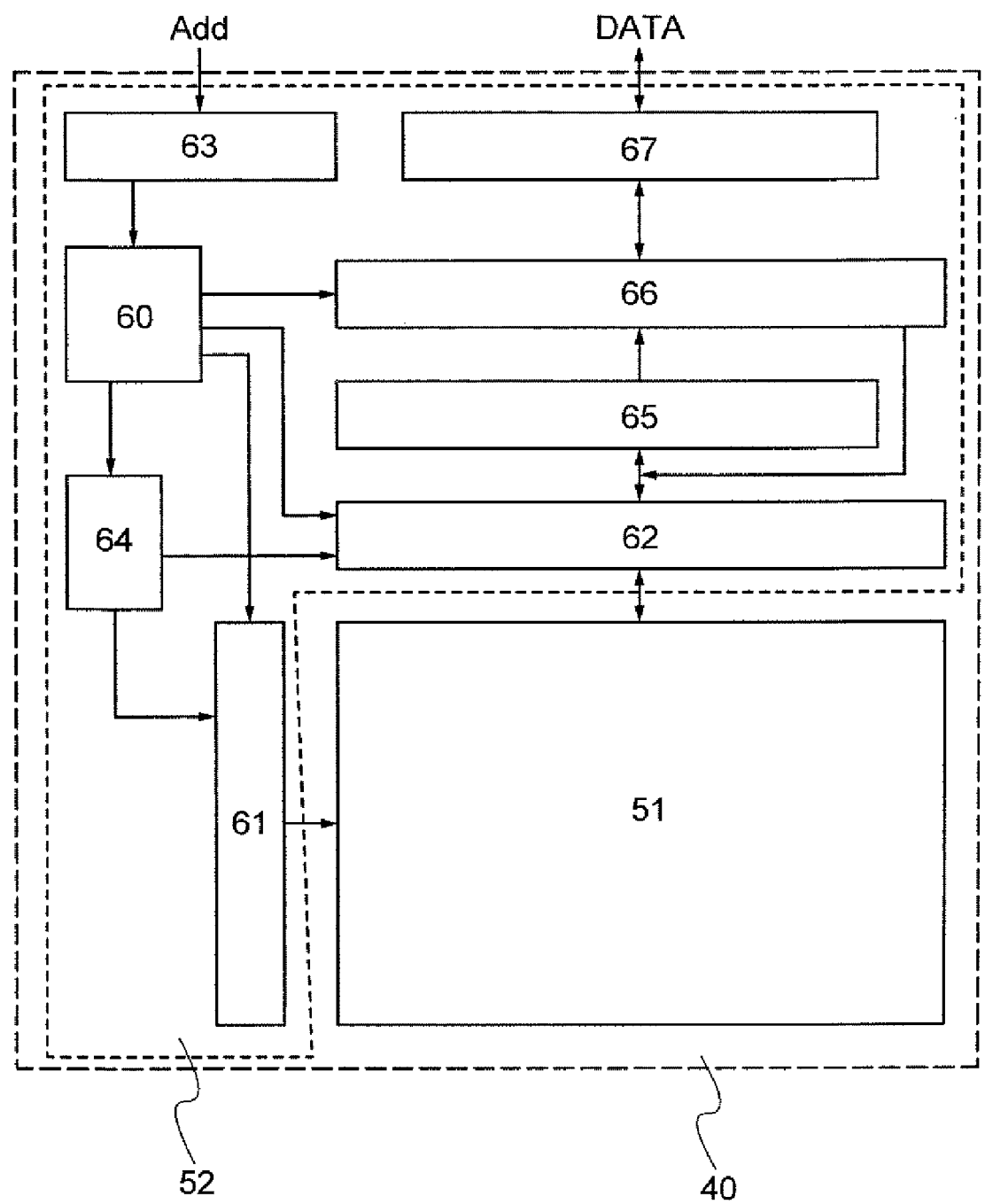
FIG. 3 is a block diagram illustrating an example of a structure of a non-volatile semiconductor memory device in accordance with one embodiment of the present invention.
Figure 4:
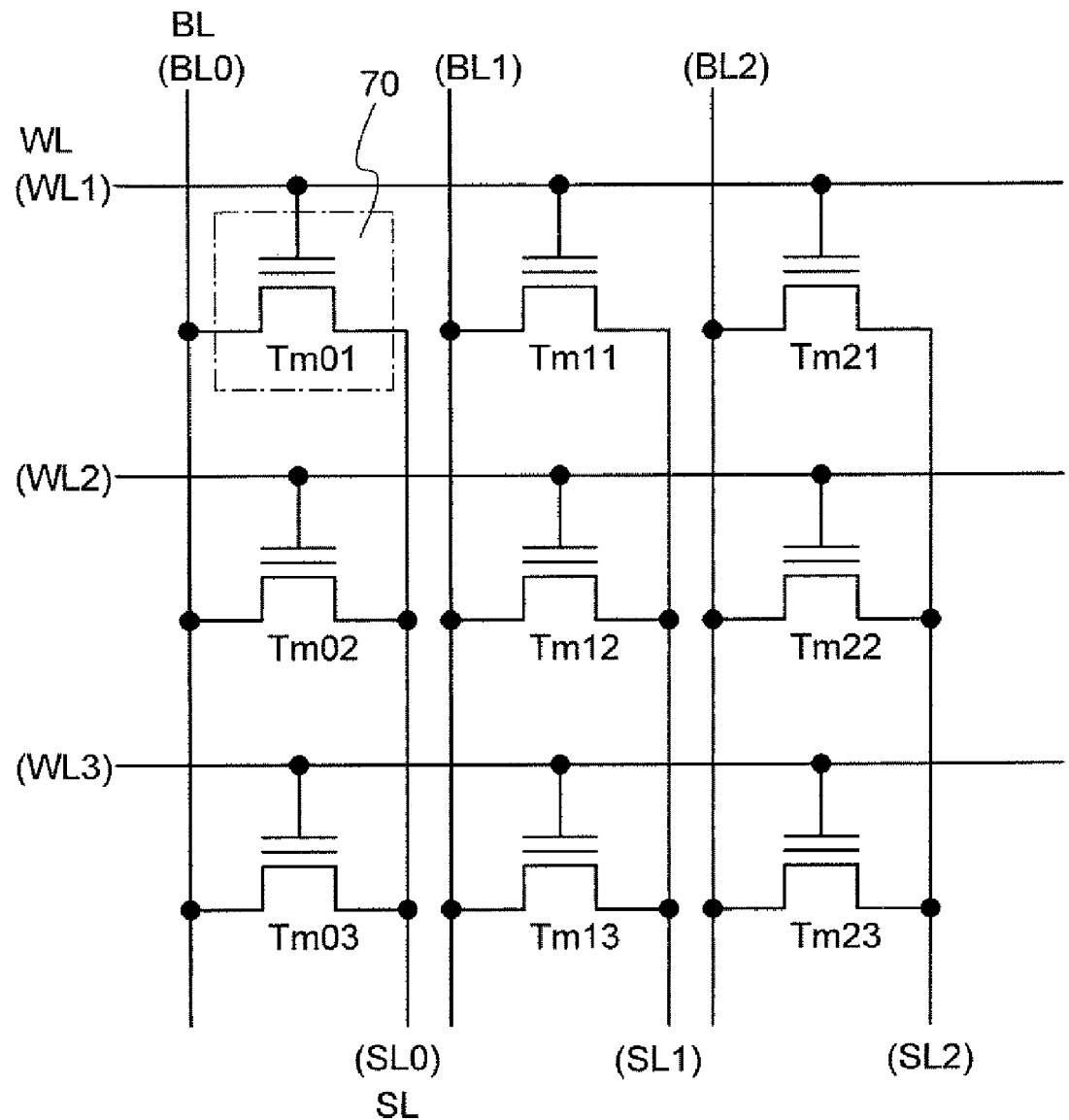
FIG. 4 is a circuit diagram illustrating an example of a structure of memory cells in accordance with one embodiment of the present invention.

The non-volatile semiconductor memory device (hereinafter, also referred to as the memory device) of this embodiment will be described with reference to FIG. 1, FIGS. 2A to 2C, FIG. 3 and FIG. 4. FIG. 1 is a plan view illustrating a layout of one memory cell of the memory device in this embodiment. FIGS. 2A to 2C are cross-sectional views taken along lines A1-A2, B1-B2 and C1-C2 of FIG. 1, respectively. FIG. 3 is a block diagram illustrating an example of a structure of the non-volatile semiconductor memory device of this embodiment, and FIG. 4 is a circuit diagram illustrating an example of a structure of the memory cells of this embodiment.

First, the non-volatile semiconductor memory device of this embodiment will be described with reference to FIG. 3. A non-volatile semiconductor memory device 40 (hereinafter, referred to as a memory device 40) includes a memory cell array 51 and a driver circuit portion 52 electrically connected to the memory cell array 51 and controlling a writing operation, an erasing operation, a reading operation and the like. The memory cell array 51 and the driver circuit portion 52 are formed over the same substrate. The memory cell array 51 includes a plurality of word lines WLs, a plurality of bit lines BLs and source lines SLs that intersect the word lines WLs, and a plurality of memory cells electrically connected to the word lines WLs, the bit lines BLs and the source lines SLs.

The driver circuit portion 52 includes a control circuit 60 for controlling the circuits in the driver circuit portion 52, a row decoder 61 for selecting a word line, a column decoder 62 for selecting a bit line, an address buffer 63, a step-up circuit 64, a sense amplifier 65, a data buffer 66 and a data input-output buffer 67. Note that FIG. 3 illustrates only an example of the structure of the driver circuit portion 52, and the structure of the non-volatile semiconductor memory device of the present invention is not limited to that of FIG. 3.

Address data Add is input to the control circuit 60 via the address buffer 63. The address data Add specifies the address of a memory cell in which data is written, read or erased. When the address data Add is input to the control circuit 60, an inner row address signal and an inner column address signal are generated by the control circuit 60 to be transferred to the row decoder 61 and the column decoder 62, respectively.

In the memory device 40, data is written and erased using a potential obtained by increasing a power supply potential. Thus, the control circuit 60 controls the step-up circuit 64 so that a potential corresponding to an operation mode is generated by the step-up circuit 64. An output of the step-up circuit 64 is supplied to the word lines WLs and the bit lines BLs formed in the memory cell array 51 via the row decoder 61 and the column decoder 62, respectively.

Data (DATA) read from the memory cell array 51 is input to the sense amplifier 65 via the column decoder 62. The data input to the sense amplifier 65 is retained in the data buffer 66. The control circuit 60 controls the data buffer 66 so that the data retained in the data buffer 66 is output from the memory device 40 via the data input-output buffer 67. Data (DATA) written to the memory cell array 51 is temporarily retained in the data buffer 66 via the data input-output buffer 67, and then transferred to the column decoder 62 under the control of the control circuit 60. Then, the data is written from the column decoder 62 to a specified memory cell of the memory cell array 51.

Next, an example of a structure of the memory cell array will be described with reference to FIG. 4. In the memory device 40, the memory cell array 51 includes a plurality of memory cells 70 arranged in matrix. FIG. 4 illustrates nine memory cells 70 arranged in three rows and three columns. In each of the memory cells 70, a non-volatile memory transistor Tm (hereinafter, referred to as a memory transistor Tm) having a floating gate is provided as a memory element. Here, a structure of the memory cell 70 defined by the bit line BL0 and the word line WL1 is described, though the other memory cells 70 have a similar structure.

In the memory cell 70, a gate of the memory transistor Tm is electrically connected to the word line WL1, a drain thereof is electrically connected to the bit line BL0, and a source thereof is electrically connected to the source line SL0.

Next, an example of writing or erasing data to and from the memory cell 70 defined by the bit line BL0 and the word line WL1 in the case where the memory transistor Tm is an n-channel transistor will be described.

For example, in the case where data is written by an F-N tunneling current, a negative high voltage is applied to the source line SL0 and the bit line BL0, and a positive high voltage is applied to the word line WL1. The potential difference between the negative high voltage and the positive high voltage is a writing voltage.

When data "1" is to be written, a positive high voltage is applied to the control gate. Therefore, in the memory transistor Tm01, an F-N tunneling current is generated in an insulating film between a channel formation region and a floating gate (an insulating film corresponding to an insulating film 108 in FIG. 1), whereby electrons are injected into the floating gate. That is, electrons are injected into the floating gate by an F-N tunneling current, so that the threshold voltage of the memory transistor Tm01 increases. In that state, data "1" is stored in the memory cell 70.

When data is to be erased, a positive high voltage is applied to the source line SL0 and the bit line BL0, and a negative high voltage is applied to the word line WL1, whereby electrons are withdrawn from the floating gate of the memory transistor Tm01 to the island-shaped semiconductor region. In that state, data "0" is stored in the memory cell 70, that is, the memory cell 70 is in an erased state. The potential difference between the positive high voltage and the negative high voltage is an erasing voltage.

Data is read, for example, in the following manner. A reading voltage having an intermediate value of the threshold voltages corresponding to data "0" and "1" is applied to the word line WL1 while the potential of the source line SL0 is 0 V and the potential of the bit line BL0 is approximately 1.5 V. Whether current flows through the bit line BL0 when the reading voltage is applied to the word line WL1 is determined by the sense amplifier 65 connected to the bit line BL.

Next, the structure of the memory cell of this embodiment will be described with reference to the plan view of FIG. 1 and the cross-sectional views of FIGS. 2A to 2C.

As illustrated in FIG. 1, one memory cell includes two island-shaped semiconductor regions 101 and 102. The two island-shaped semiconductor regions 101 and 102 form one memory element provided in the memory cell. FIG. 2A illustrates a cross-sectional structure of a part of the memory device of this embodiment, which includes the island-shaped semiconductor region 102, and FIG. 2B illustrates a cross-sectional structure of another part of the memory device, which includes the island-shaped semiconductor region 101. The two island-shaped semiconductor regions 101 and 102 are formed on an insulating surface.

As illustrated in FIG. 2A, the island-shaped semiconductor region 102 includes first impurity regions 103 and 104, second impurity regions 105 and 106, and a channel formation region 107. The channel formation region 107 is located between the second impurity region 105 and the second impurity region 106, the second impurity region 105 is located between the first impurity region 103 and the channel formation region, and the second impurity region 106 is located between the first impurity region 104 and the channel formation region. One of the first impurity regions 103 and 104 serves as a source region and the other thereof serves as a drain region. Here, the first impurity region 103 is a drain region and the first impurity region 104 is a source region.

As illustrated in FIG. 2B, the island-shaped semiconductor region 101 includes first impurity regions 133 and 134, and second impurity region 135 and a channel formation region 137 are formed between the first impurity regions 133 and 134. The first impurity region 133 is formed to surround the channel formation region 137. The first impurity region 133 is a low-resistance semiconductor region forming a connection with an electrode or a wiring.

Here, the second impurity regions 105, 106, and 135 are LDD (lightly doped drain) regions having a lower impurity concentration than the first impurity regions 103, 104, 133 and 134. In other words, the second impurity regions 105, 106, and 135 are high-resistance semiconductor regions having a higher resistance than the first impurity regions 103, 104, 133 and 134.

As illustrated in FIGS. 2A to 2C, an insulating film 130 including one or plural layers is provided over a substrate 100, and the island-shaped semiconductor regions 101 and 102 are provided over the insulating film 130. The insulating film 130 serves as an insulating surface on which the island-shaped semiconductor regions 101 and 102 are formed. As the substrate 100, for example, a glass substrate, a quartz substrate, a ceramic substrate, a resin substrate, or a semiconductor substrate can be used.

In the case where the substrate 100 is an insulating substrate such as a glass substrate or a quartz substrate, the insulating film 130 is not necessarily provided because the substrate 100 itself has an insulating surface. However, it is preferable to form the insulating film 130 in order to prevent impurities in the substrate 100 from diffusing into the island-shaped semiconductor regions 101 and 102, and to decrease the interface state density between the island-shaped semiconductor regions 101 and 102 and a base. The insulating film 130 is formed of an insulating material such as silicon oxide, silicon nitride, silicon oxynitride ($SiO_xN_y$, x>y>0), or silicon nitride oxide ($SiN_xO_y$, x>y>0). There is no particular limitation on a method for forming the insulating film 130, and the insulating film 130 can be formed by CVD, sputtering or the like. The insulating film 130 can reduce the influence of the roughness of the substrate 100 and prevent impurities in the substrate 100 from diffusing into an element formed over the insulating film 130. In the case where the insulating film 130 includes a plurality of layers, each layer can be formed of a material selected from the aforementioned insulating materials and the like depending on the purpose, such as prevention of impurity contamination or compatibility with the adjacent film.

The insulating film 108 is provided to cover the island-shaped semiconductor regions 101 and 102. A conductive film 109 forming a floating gate is provided over the insulating film 108. The conductive film 109 overlaps the island-shaped semiconductor regions 101 and 102 with the insulating film 108 interposed therebetween. In addition, the conductive film 109 is in an electrically floating state. An insulating film 110 is provided to cover the conductive film 109, and a conductive film 111 forming a control gate and a word line is provided over the insulating film 110. The conductive film 111 overlaps the floating gate (the conductive film 109) with the insulating film 110 interposed therebetween.

Since the floating gate (the conductive film 109), the insulating film 110 and the control gate (the conductive film 111) are stacked, a capacitance is formed between the floating gate and the control gate. In order to increase the coupling ratio of the memory transistor by efficiently using such a stacked structure, the entire top surface of the floating gate (the conductive film 109) overlaps the control gate (the conductive film 111) with the insulating film 110 interposed therebetween. Further, in order to obtain a large capacitance between the control gate and the floating gate, the conductive film 111 is formed to cover the side surface of the conductive film 109.

An insulating film 112 is provided over the conductive film 111. The insulating film 112 includes an opening 116 reaching the conductive film 111. Furthermore, a stack of the insulating films 112, 110 and 108 includes openings 117, 118, 119 and 120 reaching the first impurity regions 133, 134, 103 and 104, respectively (see FIG. 1).

As illustrated in FIG. 2A, a conductive film 113 forming the source line (SL) and a conductive film 114 forming the bit line (BL) are formed over the insulating film 112 and electrically connected to the first impurity regions 103 and 104 of the island-shaped semiconductor region 102 through the openings 119 and 120, respectively.

As illustrated in FIG. 2C, a conductive film 115 forming a connection electrode (or a connection wiring) is formed over the insulating film 112. The conductive film 115 is electrically connected to the conductive film 111 through the opening 116. In addition, as illustrated in FIG. 2B, the conductive film 115 is also electrically connected to the first impurity regions 133 and 134 of the island-shaped semiconductor region 101 through the openings 117 and 118, respectively. A region 121 surrounded by an alternate long and two short dashes line of FIG. 1 is a region occupied by one memory cell (a basic unit for storing data). Note that the region 121 does not include part of each of the conductive films 111, 113 and 114, which forms a wiring.

Although the insulating films 130, 108, 110 and 112 and the conductive films 109, 111, 113 and 114 each have a single-layer structure in FIGS. 2A to 2C, they may have a multi-layer structure.

Thus, a conventional non-volatile memory transistor having a floating gate is formed using the island-shaped semiconductor region 102, the insulating films 108 and 110, and the conductive films 109, 111, 113 and 114 (see FIG. 2A). In addition, since the island-shaped semiconductor region 101 is electrically connected to the control gate (the conductive film 111), the island-shaped semiconductor region 101 can function as a control gate. The island-shaped semiconductor region 101 will be hereinafter referred to as a back control gate (BCG) because it is electrically connected to the control gate and placed under the floating gate. In other words, the memory element of this embodiment is constituted by a non-volatile memory transistor including a floating gate and a back control gate.

In this embodiment, the back control gate under the floating gate as well as the control gate over the floating gate is provided, whereby the region 121 occupied by the memory cell is effectively utilized. Thus, it is possible to efficiently increase the capacitance corresponding to $C_2$ of the formula (1) relative to the area of the region 121. That is, according to this embodiment, the coupling ratio can be increased efficiently. As for the memory element of this embodiment, the potential of the floating gate and a change in the threshold voltage of the memory transistor can be represented by the following formulas (3) and (4).

$$V_{FG} = \frac{C_{21} + C_{22}}{C_1 + C_{21} + C_{22}}(V_{CG} - \Delta Vtm) \quad (3)$$

$$\Delta Vtm = -\frac{Q_{FG}}{C_{21} + C_{22}} \quad (4)$$

In the formulas (3) and (4), $V_{FG}$ is the potential of the floating gate (the conductive film 109); $V_{CG}$, the potential of the control gate (the conductive film 111); $C_1$, the capacitance between the island-shaped semiconductor region 102 and the floating gate; $C_{21}$, the capacitance between the floating gate and the back control gate; $C_{22}$, the capacitance between the floating gate and the control gate; $Q_{FG}$, the amount of charge in the floating gate; and $\Delta Vtm$, the amount of change in the threshold voltage of the memory transistor formed using the island-shaped semiconductor region 101. In the formula (3), $(C_{21}+C_{22})/(C_1+C_{21}+C_{22})$ is a coupling ratio.

Figure 15:
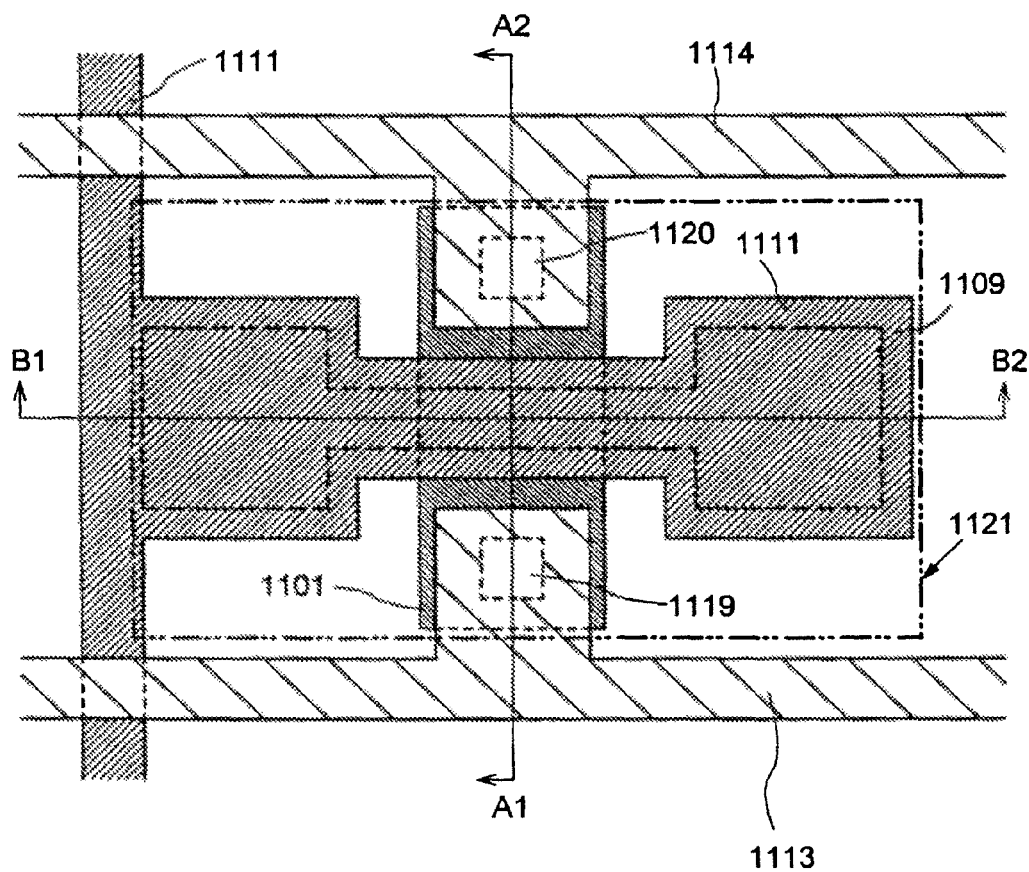
FIG. 15 is a plan view illustrating an example of a structure of a memory cell of a conventional non-volatile semiconductor memory device.

Provided that the area of the region where the conductive film 109 and the conductive film 111 overlap in FIG. 1 is equal to that of the region where the conductive film 1109 and the conductive film 1111 overlap in FIG. 15, $C_{22}=C_2$ is satisfied. In this embodiment, the capacitance corresponding to the capacitance $C_2$ of the memory transistor of FIG. 15 is $C_{21}+C_{22}$; thus, the coupling ratio is $(C_{21}+C_{22})/(C_1+C_{21}+C_{22})>C_2/(C_1+C_2)$. Therefore, the coupling ratio of the memory element of this embodiment is higher than that of the memory transistor of FIG. 15, which results in lower writing voltage and erasing voltage.

Next, the effect of this embodiment will be examined in view of the area of the memory cell. Provided that the memory element of this embodiment (see FIG. 1) and the memory transistor of FIG. 15 have the same coupling ratio and the same writing voltage and erasing voltage, this embodiment allows reduction in the capacitance $C_{22}$ necessary for achieving a desired coupling ratio. That is, in the structure of the memory element of this embodiment, it is possible to reduce the area of the region where the floating gate and the control gate overlap each other, which is necessary for obtaining the capacitance $C_{22}$; thus, the area of the memory cell can be reduced, which is advantageous in higher integration of memory cells.

In the memory transistor of FIG. 15, only the capacitance formed in the region where the conductive film 1109 and the conductive film 1111 overlap with the insulating film 1110 interposed therebetween is added between the floating gate and the control gate. On the other hand, in the present invention, by providing the back control gate in the memory transistor, the capacitance formed in the region where the island-shaped semiconductor region 101 (the back control gate) and the conductive film 109 (the floating gate) overlap with the insulating film 108 interposed therebetween, as well as the capacitance formed in the region where the conductive film 109 (the floating gate) and the conductive film 111 (the control gate) overlap with the insulating film 110 interposed therebetween, is added between the floating gate and the control gate. Furthermore, the dielectric of the capacitance formed between the back control gate and the floating gate is the insulating film 108 that can be made thinner than the insulating film 110, which allows an increase in the capacitance per unit area.

Thus, the coupling ratio of the memory device to which this embodiment is applied can be increased, resulting in lower writing voltage and erasing voltage (see the formulas (3) and (4)). In addition, in the memory device of this embodiment, a predetermined capacitance value or more is added between the floating gate and the control gate and between the floating gate and the back control gate; therefore, the area of the region where the control gate overlaps the floating gate can be reduced. That is, according to the present invention, the area of the memory cell can be reduced.

As set forth above, in the memory device of this embodiment, the coupling ratio of the memory transistor per unit area can be increased by effectively utilizing the area occupied by the memory cell. That is, a writing voltage and an erasing voltage can be reduced by increasing the coupling ratio per unit area. Furthermore, by increasing the coupling ratio per unit area, the area of the memory cell can be reduced without increasing a writing voltage and an erasing voltage.

Note that this embodiment can be applied to other embodiments as appropriate. It is also needless to say that the structure of the memory device illustrated in FIG. 1 and FIGS. 2A to 2C is only an example and a variety of known structures can be employed. For example, a plurality of LDD regions may be formed in the semiconductor film, or sidewalls may be formed on the side surfaces of the control gate. It is also possible to adopt a multi-gate structure (a structure that includes: a semiconductor film having at least to channel formation regions connected in series with each other; and at least two gate electrodes for applying an electric field to the respective channel formation regions), or a dual-gate structure (a structure in which a semiconductor film is interposed between upper and lower gate electrodes).

A method for manufacturing the memory device 40 of this embodiment will be described below.

First, the insulating film 130 is formed over the substrate 100, and the island-shaped semiconductor region 101 and the island-shaped semiconductor region 102 are formed over the insulating film 130. The island-shaped semiconductor regions 101 and 102 can be formed using a semiconductor film containing silicon (Si) or germanium (Ge) as its main component (e.g., Si, Ge, silicon carbide, or $Si_xGe_{1-x}$ (0<x<1)). Such a semiconductor film can be formed by CVD, sputtering or the like. In addition, the semiconductor film forming the island-shaped semiconductor regions 101 and 102 may have any of amorphous, microcrystalline, polycrystalline, and single crystal structures, and may adopt any of these structures depending on the characteristics required for the memory device 40.

For example, a polycrystalline semiconductor film can be formed by crystallizing an amorphous semiconductor film. Crystallization of the amorphous semiconductor film can be performed by laser crystallization, thermal crystallization using RTA or an annealing furnace, thermal crystallization using a metal element that promotes crystallization, a combination of any of these crystallizations, or the like.

In the laser crystallization, it is possible to use a gas laser such as an Ar laser, a Kr laser, or a $CO_2$ laser; a metal vapor laser such as a helium-cadmium laser; or a solid-state laser such as a YAG laser, a YLF laser, a $YAlO_3$ laser, a $GdVO_4$ laser, a KGW laser, a KYW laser, an alexandrite laser, a Ti:sapphire laser, a $Y_2O_3$ laser, or a $YVO_4$ laser. Note that laser light oscillating in TEM (single transverse mode) is preferably emitted from a laser because a beam spot on a surface to be irradiated can have more homogeneous energy.

Specifically, a second harmonic (a wavelength of 532 nm) of a semiconductor laser (LD) pumped continuous wave (CW) laser ($YVO_4$) can be used. Although there is no particular limitation on the wavelength, the second harmonic is superior to other higher harmonics in terms of energy efficiency. When a semiconductor film is irradiated with a CW laser beam, energy can be continuously supplied to the semiconductor film. Therefore, once the semiconductor film is melted, the melt state can be maintained. Furthermore, by scanning the semiconductor film with a CW laser beam, a solid-liquid interface of the semiconductor film can be moved and crystal grains that are long in one direction can be formed along the moving direction. The reason for using a solid-state laser is that more stable output can be obtained and more stable treatment can be performed as compared with the case of using a gas laser or the like. Instead of the CW laser, a pulsed laser having a repetition rate of 10 MHz or more can also be used for the laser crystallization. By using a pulsed laser with a high repetition rate, if the pulse interval of the laser is shorter than the time it takes for the semiconductor film to be solidified after being melted, the semiconductor film can be kept in a melt state while being irradiated with a laser beam, and a semiconductor film including crystal grains that are long in one direction can be formed by moving the solid-liquid interface. Other CW lasers or pulsed lasers having a repetition rate of 10 MHz or more can also be used. Besides, a pulsed excimer laser may also be used.

A single crystal semiconductor film can be formed in the following manner: oxygen molecules are implanted from a silicon crystal surface by ion implantation and then oxidized at a high temperature, whereby a silicon oxide insulating film is formed in the silicon crystal. Alternatively, a single crystal semiconductor film may be formed in such a manner that two silicon wafers are prepared; an embrittlement layer used for separation is formed in one of the silicon wafers by ion implantation; the two silicon wafers are bonded to each other; and the one substrate is separated. In the latter case, the silicon wafer including the embrittlement layer may be bonded to a glass substrate.

A semiconductor region (a semiconductor film) having an appropriate crystal structure is formed over the substrate 100 and then selectively etched, so that the island-shaped semiconductor regions 101 and 102 can be formed.

Then, the insulating film 108 is formed over the island-shaped semiconductor regions 101 and 102. As the insulating film 108, a film containing at least oxygen is formed. The insulating film 108 can be formed of, for example, silicon oxide, silicon oxynitride ($SiO_xN_y$, x>y>0), silicon nitride oxide ($SiN_xO_y$, x>y>0), aluminum oxide or tantalum oxide by CVD or sputtering. Besides, a high-dielectric-constant material such as hafnium oxide can also be used. Such a film can be formed by CVD, sputtering or the like. The insulating film 108 can also be formed by the solid-phase oxidation of the island-shaped semiconductor regions 101 and 102 using high-density plasma. For example, in the case where the insulating film 108 is formed of silicon oxide or silicon oxynitride, the thickness thereof is preferably 1 nm to 20 nm, and more preferably 7 nm to 10 nm.

In the case where the insulating film 108 is formed of silicon oxynitride, it can be deposited by a plasma CVD apparatus using a monosilane ($SiH_4$) gas and a dinitrogen monoxide ($N_2O$) gas as source gases. The deposition conditions in that case are as follows. The mass flow ratio of the source gases is $SiH_4:N_2O=1:800$, and in the plasma CVD apparatus, the high-frequency power is 150 W; the frequency, 60 MHz; the deposition temperature (substrate temperature), 400° C.; the pressure in the chamber, 40 Pa; and the electrode interval, 28 mm. Note that in this specification, the mass flow ratio of gases is the ratio of the mass flow rate (sccm) of gases supplied to the deposition chamber.

Plasma oxidation may be performed on the insulating film 108. The plasma oxidation is preferably performed using high-density plasma that is excited at a high frequency such as a microwave (typically, 2.45 GHz), and has an electron density of $1\times10^{11}$ cm$^{-3}$ or more and an electron temperature of 1.5 eV or less. Specifically, the high-density plasma has an electron density of $1\times10^{11}$ cm$^3$ to $1\times10^{13}$ cm$^{-3}$ and an electron temperature of 0.5 eV to 1.5 eV. It is preferable that the plasma oxidation be performed on the insulating film 108 for 60 seconds or more. For example, after the plasma oxidation treatment is performed on the island-shaped semiconductor regions 101 and 102, a silicon oxynitride film is formed by the plasma CVD apparatus under the above conditions and plasma oxidation treatment is performed on the silicon oxynitride film, whereby the insulating film 108 can be formed.

Then, the conductive film 109 is formed over the insulating film 108. The conductive film 109 may have a single-layer structure or a multi-layer structure. The conductive film having a single-layer or multi-layer structure is formed, and selectively removed by etching or the like to be processed into a desired shape, whereby the conductive film 109 can be formed. The conductive film 109 can be made of a metal selected from tantalum (Ta), tungsten (W), titanium (Ti), molybdenum (Mo), aluminum (Al), copper (Cu), chromium (Cr), niobium (Nb) and the like; an alloy or a metal compound containing any of these metals as its main component (e.g., silicide or metal nitride); or a semiconductor typified by polycrystalline silicon doped with an impurity element such as phosphorus. Such a conductive film can be formed by CVD, sputtering or the like.

Figure 6A:
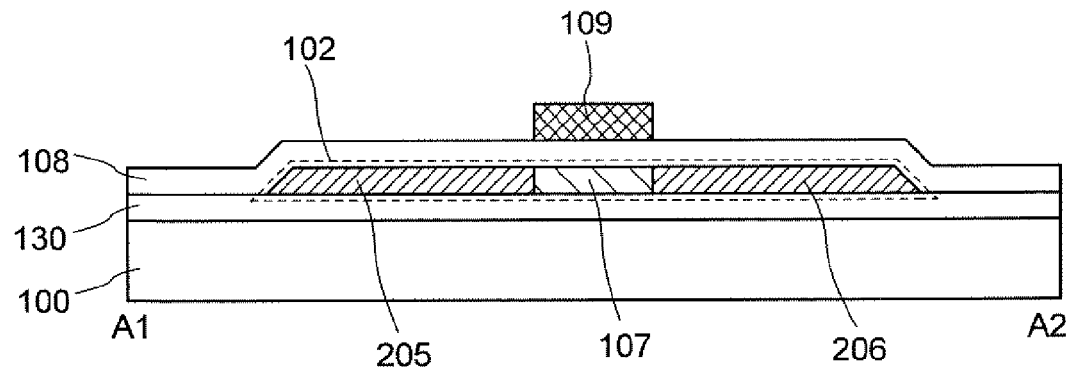
FIGS. 6A to 6C are cross-sectional views taken along lines A1-A2, B1-B2 and C1-C2 of FIG. 5, respectively.
Figure 6B:
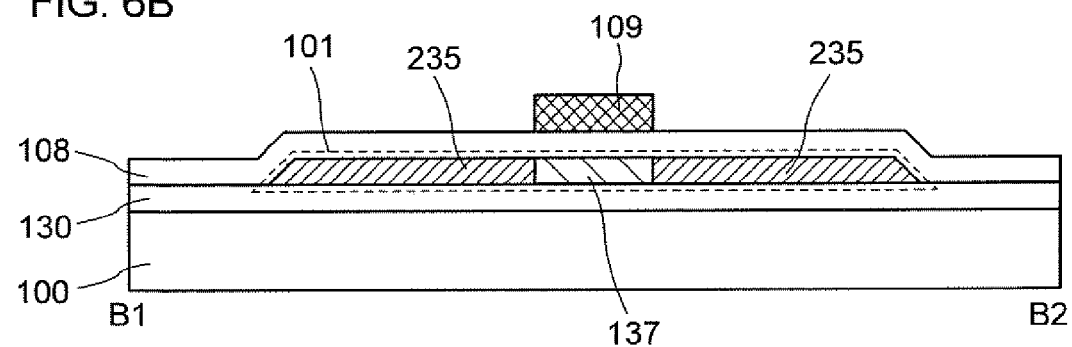
Figure 6C:
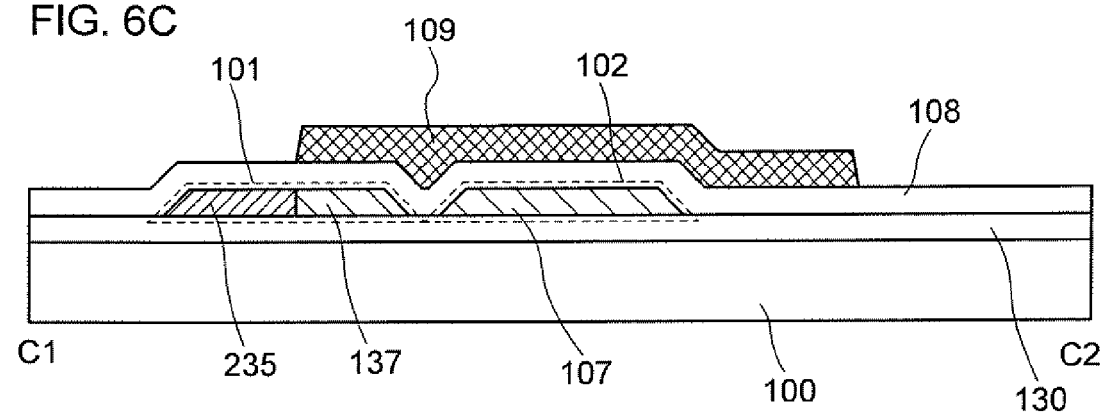

Next, an n-type or p-type impurity element is added to the island-shaped semiconductor regions 101 and 102 using the conductive film 109 as a mask, so that an impurity region is formed in each of the island-shaped semiconductor regions 101 and 102. As the impurity element imparting n-type conductivity, phosphorus (P), arsenic (As) or the like can be used. As the impurity element imparting p-type conductivity, boron (B), aluminum (Al), gallium (Ga) or the like can be used. This step of adding the impurity element is to form the second impurity regions 105 and 106 in the island-shaped semiconductor region 102. FIG. 5 is a plan view of the memory cell 70 of the memory device 40, in which the step of adding the impurity element has been completed. FIGS. 6A to 6C are cross-sectional views taken along lines A1-A2, B1-B2 and C1-C2 of FIG. 5, respectively.

As illustrated in FIG. 6A, a part of the island-shaped semiconductor region 102, which overlaps the conductive film 109, becomes the channel formation region 107, and impurity regions 205 and 206 to which the impurity element has been added correspond to the second impurity regions 105 and 106, respectively. As illustrated in FIG. 6B, a part of the island-shaped semiconductor region 101, which overlaps the conductive film 109, becomes the channel formation region 137, and impurity region 235 to which the impurity element has been added correspond to the second impurity region 135.

Next, the insulating film 110 is formed. As the insulating film 110, an insulating film containing oxygen or nitrogen, such as a silicon oxide film, a silicon nitride film, a silicon oxynitride ($SiO_xN_y$, x>y>0) film, or a silicon nitride oxide ($SiN_xO_y$, x>y>0) film, can be formed by CVD, sputtering, coating or the like. The thickness of the insulating film 110 is preferably 10 nm to 100 nm, and more preferably 20 nm to 50 nm.

Then, the conductive film 111 is formed over the insulating film 110. The conductive film 111 forms the word line and the control gate. The conductive film 111 can be formed in a manner similar to that of the conductive film 109.

In this embodiment, the bottom surface of the conductive film 109 is covered with the insulating film 108, and the top and side surfaces thereof is covered with only the insulating film 110. Thus, the charge accumulated in the conductive film 109 can be easily retained, which is advantageous in improving the charge retention characteristics of the memory element. This is because the upper limit of the heating temperature is approximately 600° C. if a glass substrate is used as the substrate 100; therefore, an insulating film that can be formed has a lower withstand voltage than that obtained by high-temperature heat treatment, and thus, the leakage of charge from the floating gate can be prevented more effectively with a smaller number of insulating films surrounding the conductive film 109 and a simpler element structure.

Figure 7:
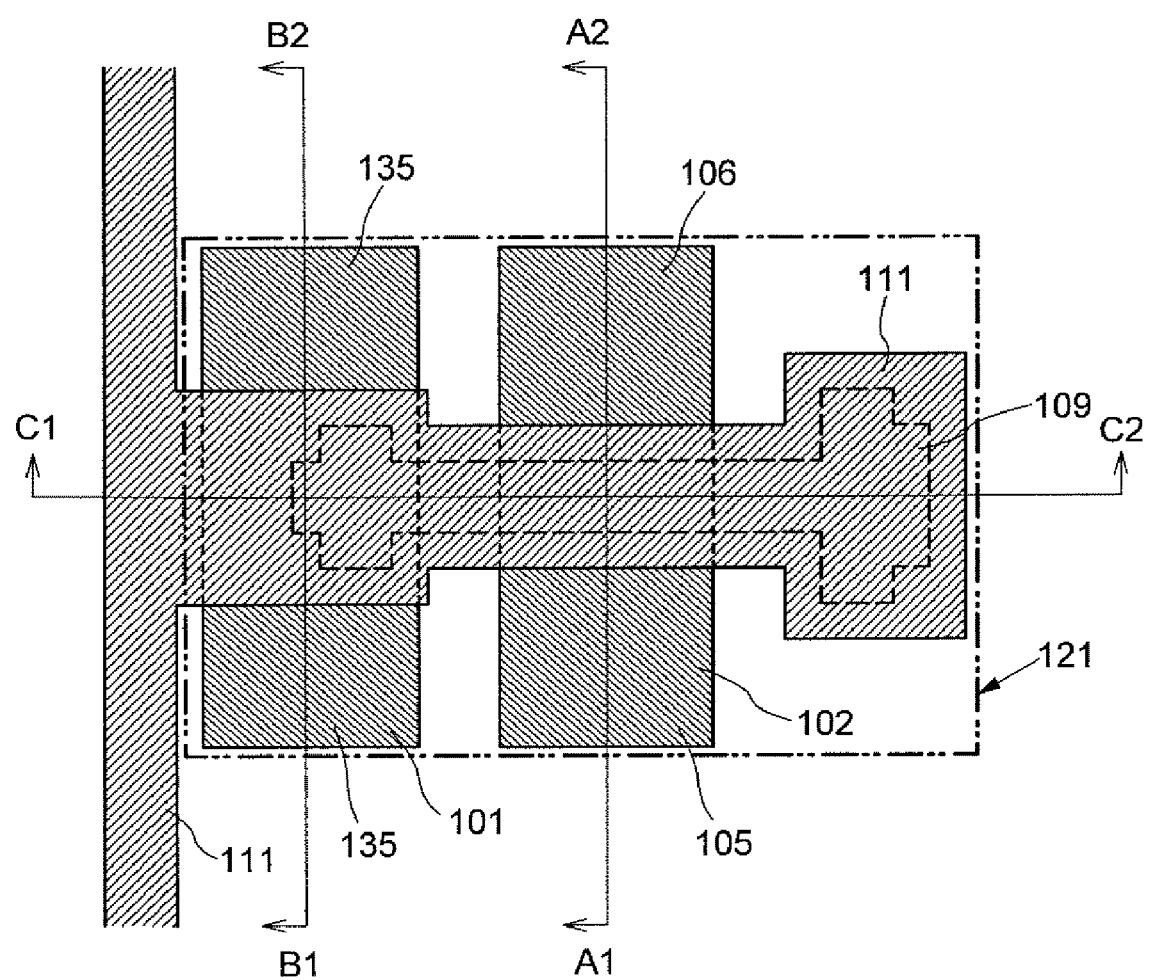
FIG. 7 is a plan view illustrating a method for manufacturing a non-volatile semiconductor memory device in accordance with one embodiment of the present invention.
Figure 8A:
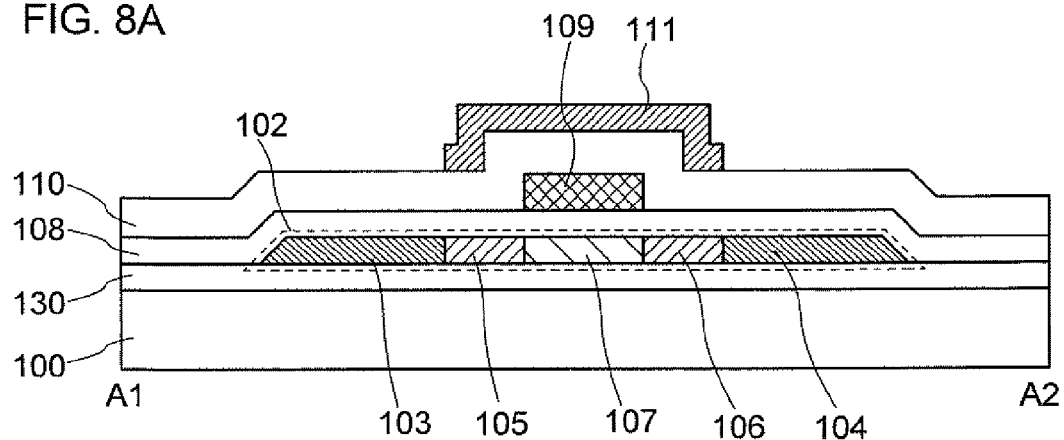
FIGS. 8A to 8C are cross-sectional views taken along lines A1-A2, B1-B2 and C1-C2 of FIG. 7, respectively.
Figure 8B:
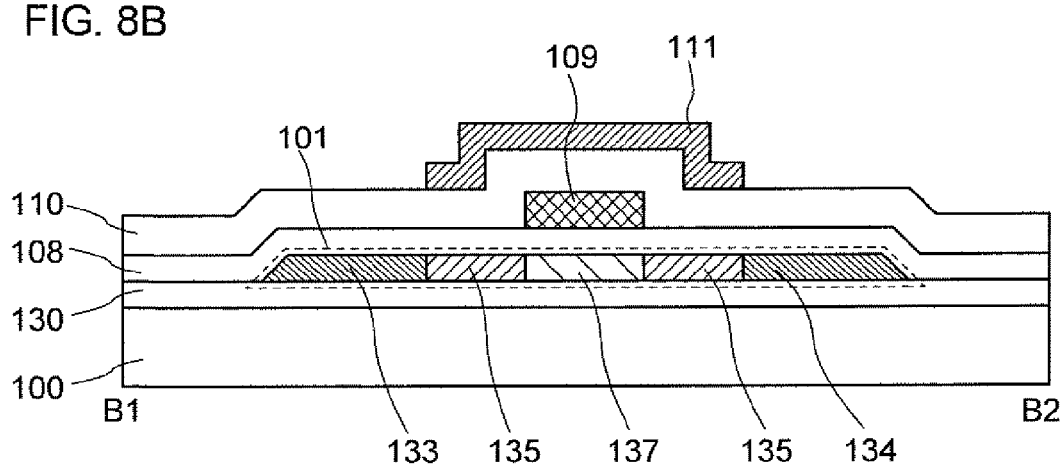
Figure 8C:
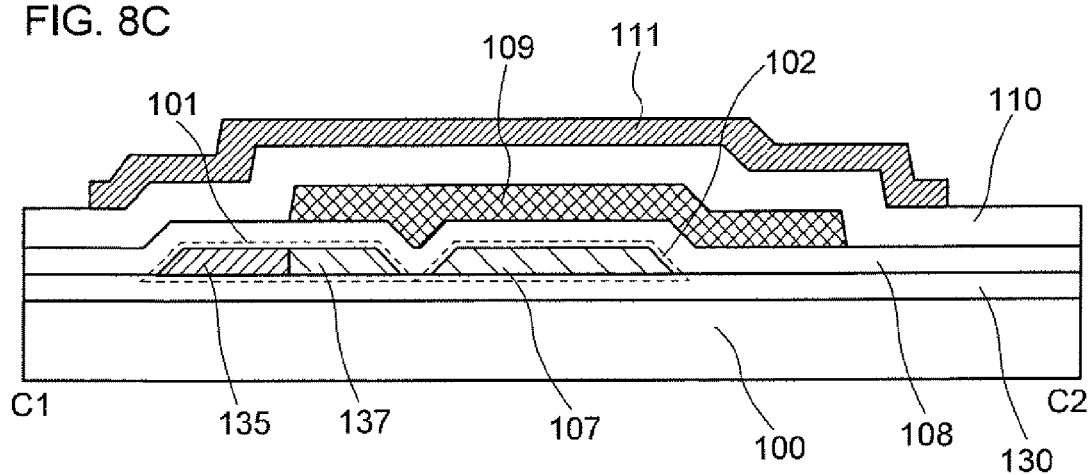

Next, an n-type or p-type impurity element is added to the island-shaped semiconductor regions 101 and 102 using the conductive film 111 as a mask. FIG. 7 is a plan view of the memory cell in which this step of adding the impurity element has been completed. FIGS. 8A to 8C are cross-sectional views taken along lines A1-A2, B1-B2 and C1-C2 of FIG. 7, respectively.

As illustrated in FIG. 8A, the first impurity regions 103 and 104 are formed in the island-shaped semiconductor region 102. The first impurity regions 103 and 104 form a source region or a drain region of the memory transistor. Parts of the impurity regions 205 and 206 (see FIG. 6A), which overlap the conductive film 111, become the second impurity regions 105 and 106, respectively. As illustrated in FIG. 8B, the first impurity regions 133 and 134 are formed in the island-shaped semiconductor region 101. Parts of the impurity regions 235 and 236 (see FIG. 6B), which overlap the conductive film 111, become the second impurity region 135.

Here, the second impurity regions 105, 106, and 135 are formed as LDD (lightly doped drain) regions having a lower impurity concentration than the first impurity regions 103, 104, 133 and 134. If the impurity concentration of the second impurity regions 105, 106, and 135 is made substantially equal to that of the first impurity regions 103, 104, 133 and 134, the second impurity regions 105, 106, and 135 can function as a source region or a drain region. Furthermore, if the step of adding the impurity element using the conductive film 109 as a mask is omitted, the second impurity regions 105, 106, and 135 have an impurity concentration substantially equal to that of the channel formation regions 107 and 137.

When the impurity concentration of the first impurity regions 103 and 104 is substantially equal to that of the second impurity regions 105 and 106, the highest ON characteristics of the memory transistor can be obtained. Note that an excess of impurity element added to the first impurity regions 103 and 104 causes damage to the insulating film 108, which may lower the reliability of the memory transistor. When the impurity concentration of the second impurity regions 105 and 106 is substantially equal to that of the channel formation region 107, a so-called offset memory transistor is obtained. Accordingly, excessive erasing of data can be prevented and the memory transistor after the erasing operation can be kept in a normally-off state. In this embodiment, by making the second impurity regions 105, 106, and 135 LDD regions having a lower impurity concentration than the first impurity regions 103, 104, 133 and 134, the ON characteristics of the memory transistor as well as the resistance to hot electrons can be improved.

Next, the insulating film 112 is formed. The insulating film 112 can be formed of an insulating film containing oxygen or nitrogen, such as a silicon oxide film, a silicon nitride film, a silicon oxynitride ($SiO_xN_y$, x>y>0) film, or a silicon nitride oxide ($SiN_xO_y$, x>y>0) film, a film containing carbon such as DLC (diamond like carbon), a film containing an organic material such as epoxy, polyimide, polyamide, polyvinyl phenol, benzocyclobutene, or acrylic, or a film containing a siloxane material such as a siloxane resin. Such an insulating film can be formed by CVD, sputtering, coating or the like.

Note that the siloxane material is a material having Si—O—Si bonds. Siloxane has a skeleton formed by a bond of silicon (Si) and oxygen (O). As a substituent, an organic group containing at least hydrogen (e.g., an alkyl group or an aryl group) is used. Alternatively, a fluoro group may be used as the substituent. Further alternatively, an organic group containing at least hydrogen and a fluoro group may also be used as a substituent. It is preferable that a film containing an organic material or a siloxane material be formed as the insulating film 112 because unevenness due to the semiconductor film, the conductive film and the like can be reduced. Note that, since moisture is easily absorbed in and passes through the film containing an organic material or a siloxane material, if other films such as the semiconductor film, the insulating film and the conductive film are highly likely to be adversely affected, a film containing an inorganic material is preferably formed on the top and/or bottom surface of the film containing an organic material or a siloxane material. For the film containing an inorganic material, a film containing silicon nitride, silicon nitride oxide or the like is particularly preferable because of its high blocking effect against moisture.

Then, the insulating films 112, 110 and 108 are selectively removed by etching, whereby the opening 116 reaching the conductive film 111, the openings 117 and 118 respectively reaching the first impurity regions 133 and 134 formed in the island-shaped semiconductor region 101, and the openings 119 and 120 respectively reaching the first impurity regions 103 and 104 formed in the island-shaped semiconductor region 102 are formed.

Next, a conductive film is formed over the insulating film 112 and processed into a predetermined shape by etching, whereby the conductive films 113 to 115 are formed. Each of the conductive films 113 to 115 may have a single-layer structure or a multi-layer structure. The conductive films 113 to 115 can be made of a metal selected from aluminum (Al), tungsten (W), titanium (Ti), tantalum (Ta), molybdenum (Mo), nickel (Ni), platinum (Pt), copper (Cu), gold (Au), silver (Ag), manganese (Mn) and neodymium (Nd), or an alloy or a metal compound containing any of these metals as its main component. Such a metal film or a film containing a metal as its main component can be formed by CVD, sputtering or the like. As an alloy containing aluminum as its main component, for example, there is an alloy containing aluminum as its main component and also containing nickel, or an alloy containing aluminum as its main component and also containing nickel and one or both of carbon and silicon.

In the case where each of the conductive films 113 to 115 has a multi-layer structure, it is possible to employ a stacked structure of a barrier film, an aluminum-silicon film and a barrier film, or a stacked structure of a barrier film, an aluminum-silicon film, a titanium nitride film and a barrier film. For the barrier film, titanium, a nitride of titanium, molybdenum, or a nitride of molybdenum can be used for example. Aluminum or a material containing aluminum as its main component, such as aluminum silicon, is suitable for the material of the conductive films 113 to 115 because of its low resistance and low price; however, hillocks are likely to be generated. Thus, in the case where a film containing aluminum as its main component is used as the conductive films 113 to 115, the barrier film is preferably provided on the top and bottom surfaces of the aluminum film to prevent generation of hillocks. Also in that ease, a barrier film containing titanium that has a high reducing property is preferably formed on the bottom surface of the film containing aluminum as its main component. This is because, even if a thin natural oxide film is formed on the semiconductor film, it can be reduced so that a favorable contact between the conductive films 113 and 114 and the island-shaped semiconductor regions 101 and 102 can be achieved.

Although the conductive film 115 is formed in the same process as the conductive films 113 and 114, it may be formed in a different process than the conductive films 113 and 114.

Through the above steps, the memory cell array 51 including a plurality of the memory cells 70 is completed. In addition, transistors, capacitors, resistors and the like included in the driver circuit portion 52 of the memory device 40 are manufactured in the same manufacturing process as the memory cell array 51, and thus the driver circuit portion 52 as well as the memory cell array 51 is manufactured over the substrate 100. Accordingly, the memory device 40 of this embodiment is completed.

Although the back control gate is formed of the semiconductor film that is manufactured at the same time as the island-shaped semiconductor region 102, it may be formed of another conductive film. This conductive film may have a single-layer structure or a multi-layer structure. For example, by CVD or sputtering, the conductive film forming the back control gate can be formed of a metal selected from tantalum (Ta), tungsten (W), titanium (Ti), molybdenum (Mo) and aluminum (Al), or an alloy or a metal compound containing any of these metals as its main component (e.g., silicide or metal nitride).

It is needless to say that the method for manufacturing the memory device described in this embodiment is only an example, and a variety of known methods can be employed. The method for manufacturing the memory device described in this embodiment can be applied to methods for manufacturing a memory device described in the other embodiments.

Embodiment 2

This embodiment is a modified example of Embodiment 1. A memory device of this embodiment includes a memory element in which an insulating film between an island-shaped semiconductor region and a floating gate is partially different in thickness. This embodiment will be described below with reference to FIG. 9 and FIGS. 10A to 10C.

Figure 9:
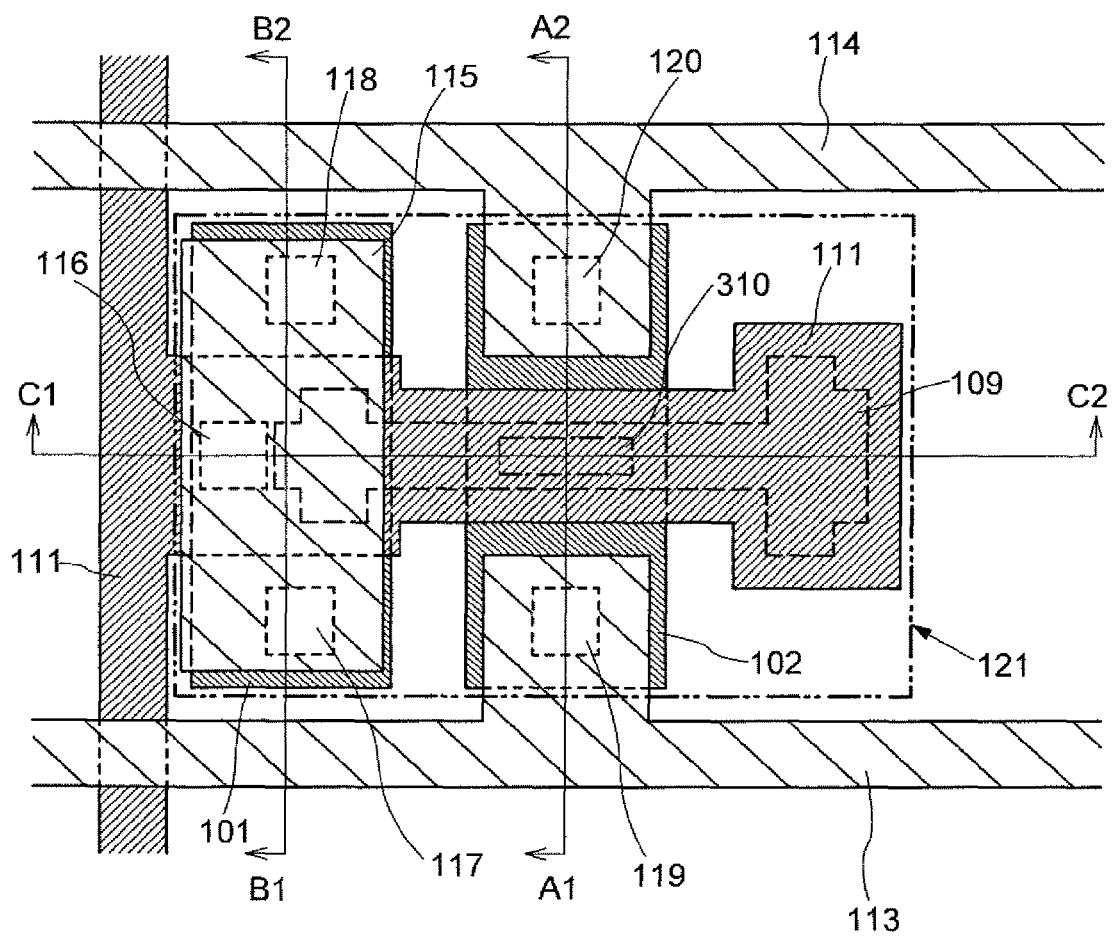
FIG. 9 is a plan view illustrating an example of a structure of a memory cell of a non-volatile semiconductor memory device in accordance with one embodiment of the present invention.
Figure 10A:
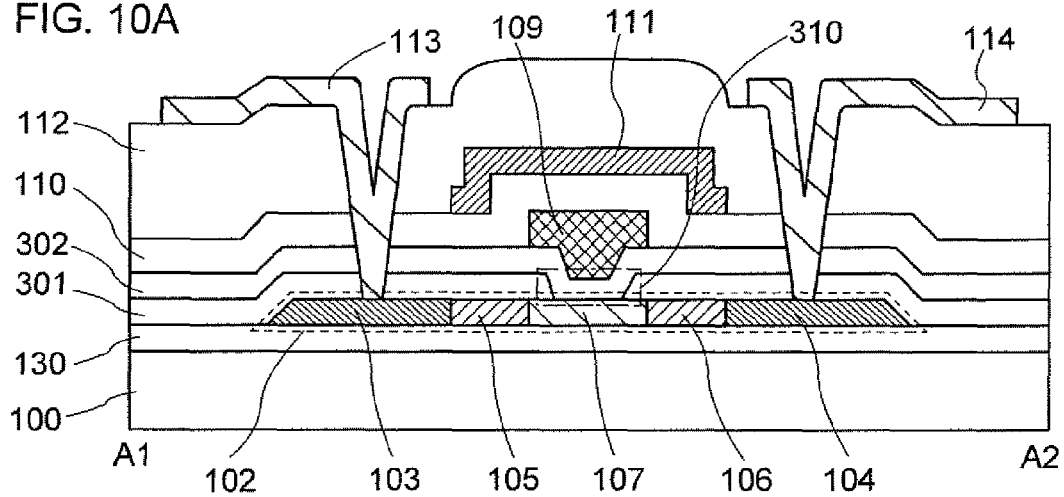
FIGS. 10A to 10C are cross-sectional views taken along lines A1-A2, B1-B2 and C1-C2 of FIG. 9, respectively.
Figure 10B:
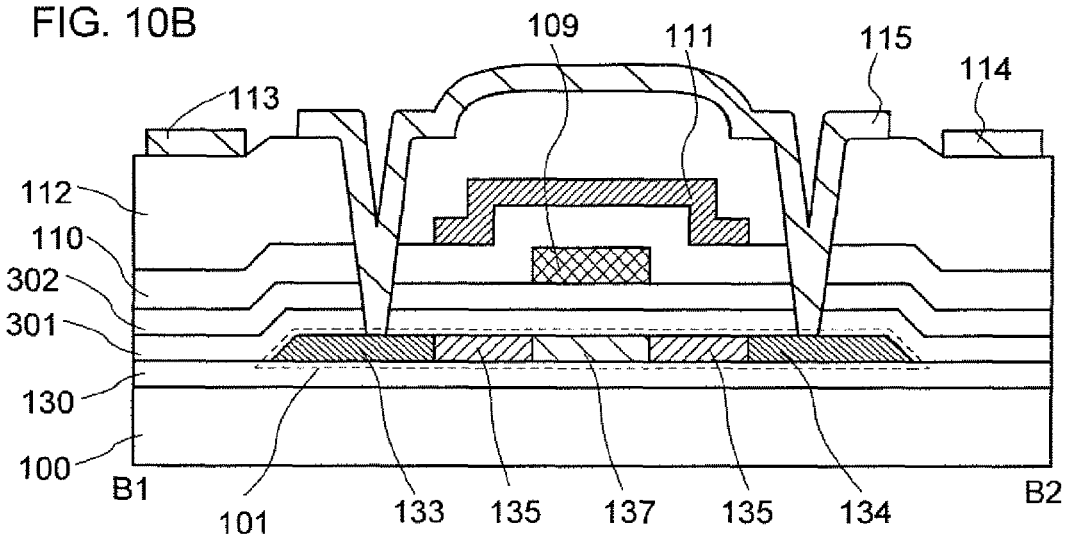
Figure 10C:
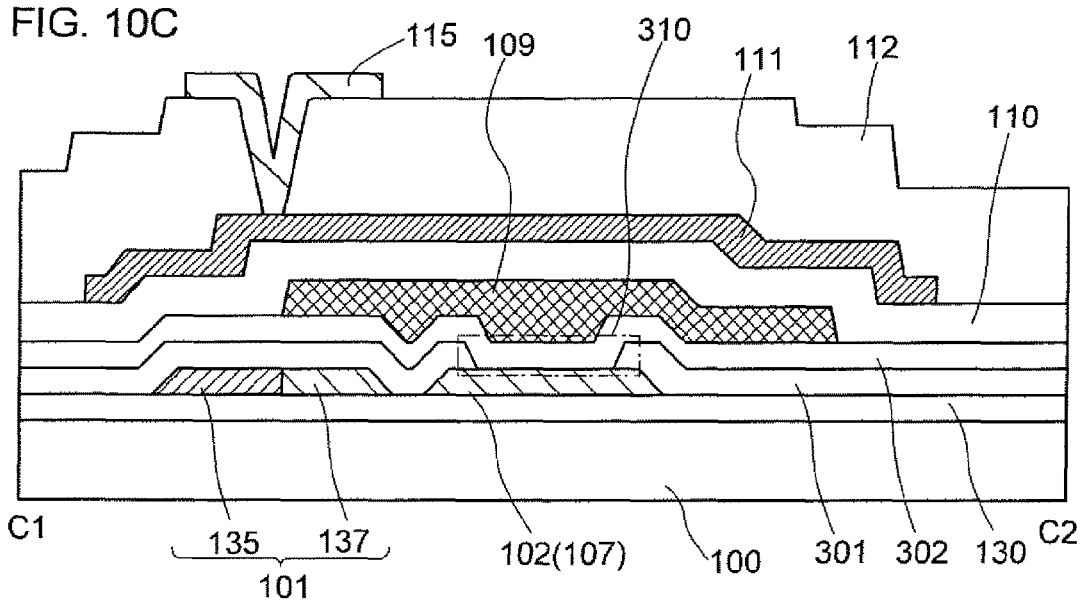

FIG. 9 is a plan view illustrating an example of a structure of a memory cell of this embodiment, and FIGS. 10A to 10C are cross-sectional views taken along lines A1-A2, B1-B2 and C1-C2 of FIG. 9, respectively. A manufacturing method and a structure of the memory cell of this embodiment will be described below. Note that the description on the structure similar to that of Embodiment 1 is omitted.

First, as described in Embodiment 1, the island-shaped semiconductor regions 101 and 102 are formed over the substrate 100 with the insulating film 130 interposed therebetween. Then, an insulating film 301 having a single-layer structure or a multi-layer structure is formed to cover the island-shaped semiconductor regions 101 and 102. As the insulating film 301, an insulating film containing at least oxygen is formed. Such an insulating film can be formed of, for example, an oxide of silicon such as silicon oxide, silicon oxynitride ($SiO_xN_y$, x>y>0), or silicon nitride oxide ($SiN_xO_y$, x>y>0); a metal oxide such as aluminum oxide; or a high-dielectric-constant material such as tantalum oxide or hafnium oxide. The insulating film 301 is formed by solid-phase oxidation with high-density plasma, CVD, sputtering or the like. If a silicon oxide film or a silicon oxynitride film is used, the insulating film 301 is preferably formed to a thickness of 1 nm to 50 nm, and more preferably to a thickness of 3 nm to 30 nm.

Next the insulating film 301 is selectively removed by etching, whereby an opening 310 reaching the island-shaped semiconductor region 102 is formed. The opening 310 is formed in part of a region where the island-shaped semiconductor region 102 overlaps the conductive film 109 and the conductive film 111. In other words, the opening 310 partially overlaps the channel formation region 107 formed in the island-shaped semiconductor region 102.

Then, an insulating film 302 having a single-layer structure or a multi-layer structure is formed to cover the island-shaped semiconductor regions 101 and 102 and the insulating film 301. The insulating film 302 can be formed in a manner similar to that of the insulating film 108. The thickness of the insulating film 302 is preferably 1 nm to 20 nm, and more preferably 7 nm to 10 nm. In this embodiment, a stacked structure of the insulating film 301 having the opening 310, and the insulating film 302 is employed so that the thickness of the insulating film between the island-shaped semiconductor region 102 and the floating gate is partially reduced. The following steps can be performed in a manner similar to those of Embodiment 1, and the memory device of this embodiment can be manufactured.

In the memory device of this embodiment similarly to in the memory device of Embodiment 1, a back control gate (BCG) is provided in the memory element. Therefore, the coupling ratio is increased and a writing voltage and an erasing voltage can be reduced without increasing the area of the memory cell.

Furthermore, it is possible to reduce the area of the memory cell, which is necessary for achieving a desired coupling ratio. That is, the area of the memory cell can be reduced without increasing a writing voltage and an erasing voltage, which makes it easier for the memory cell to be highly integrated.

It is preferable that the opening formed in the insulating film 301 include at least a region that overlaps the channel formation region 107. The opening 310 illustrated in FIG. 9 is one such example. Alternatively, an opening 320 may be formed in the insulating film 301 so as to include a region that does not overlap the conductive film 109 and the conductive film 111.

Figure 11:
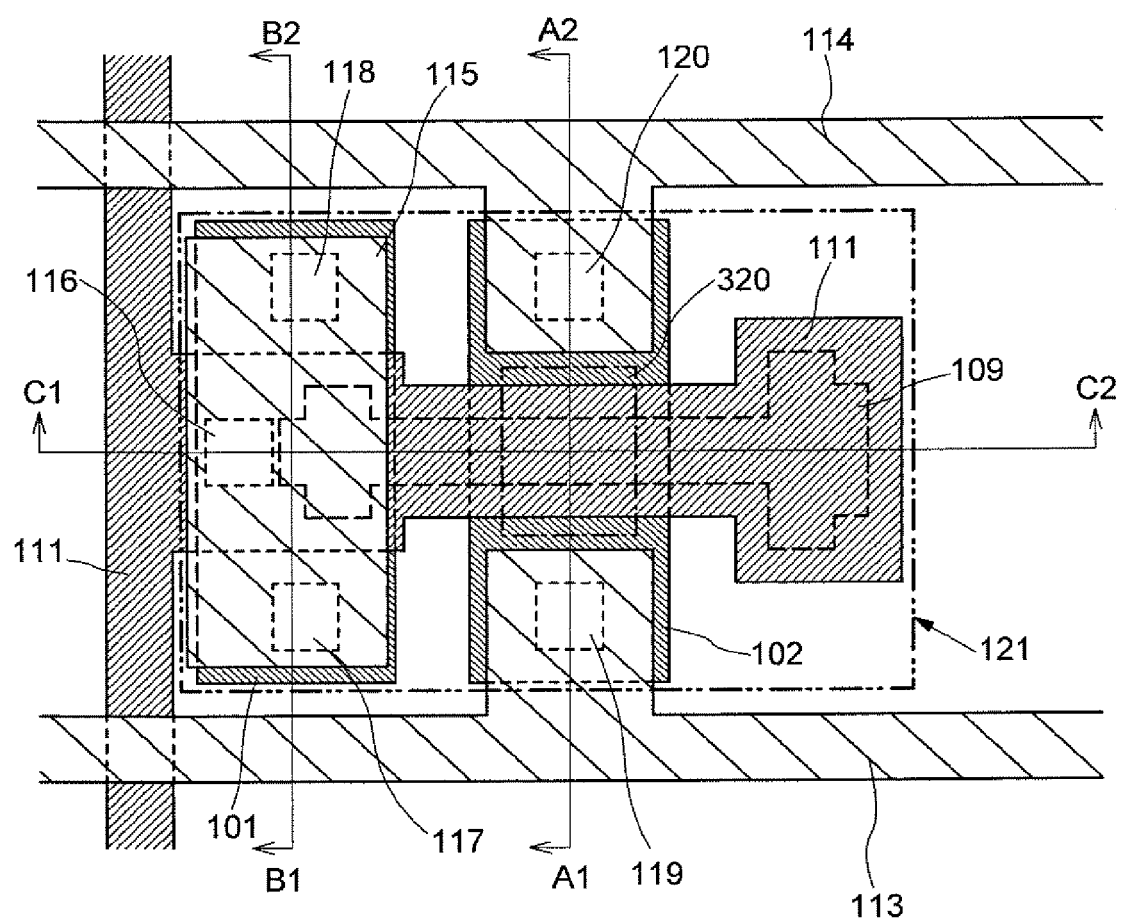
FIG. 11 is a plan view illustrating an example of a structure of a memory cell of a non-volatile semiconductor memory device in accordance with one embodiment of the present invention.
Figure 12A:
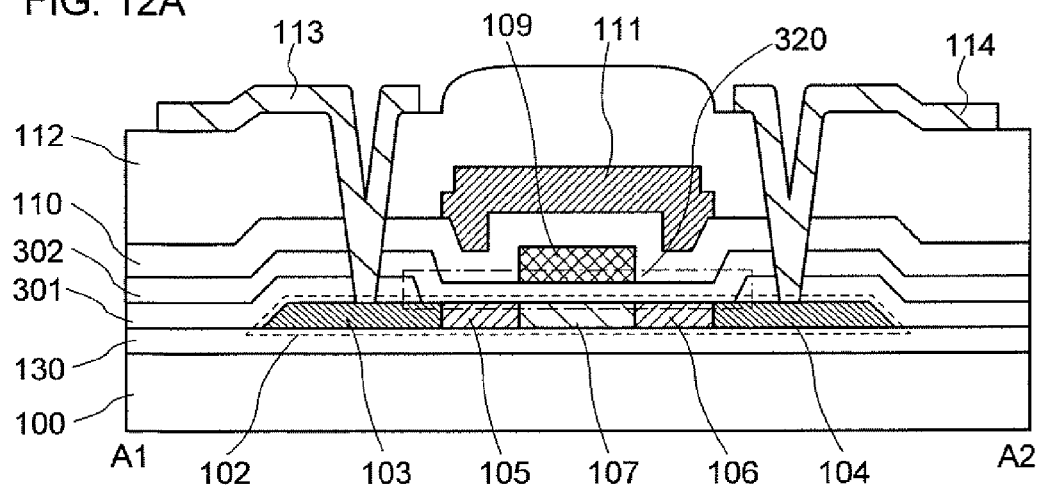
FIGS. 12A to 12C are cross-sectional views taken along lines A1-A2, B1-B2 and C1-C2 of FIG. 11, respectively.
Figure 12B:
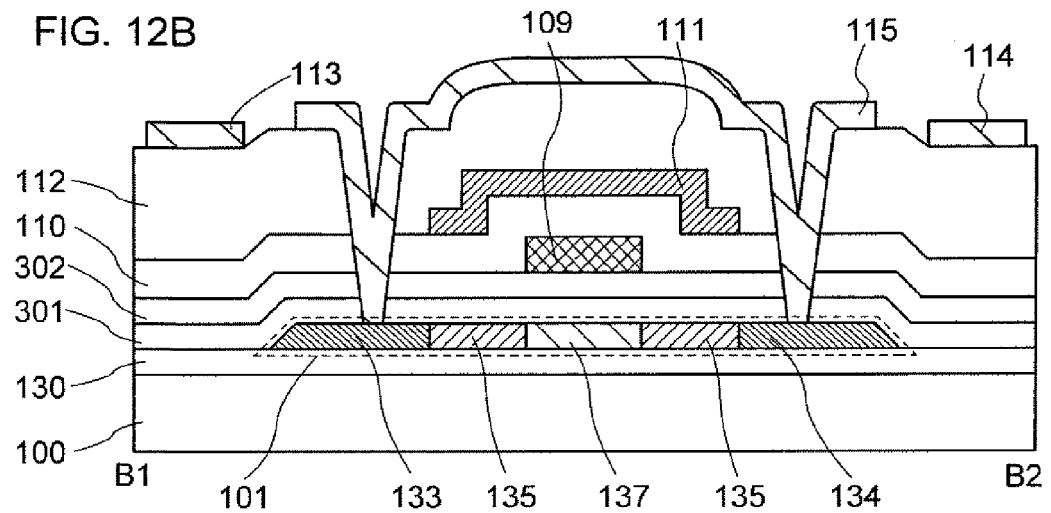
Figure 12C:
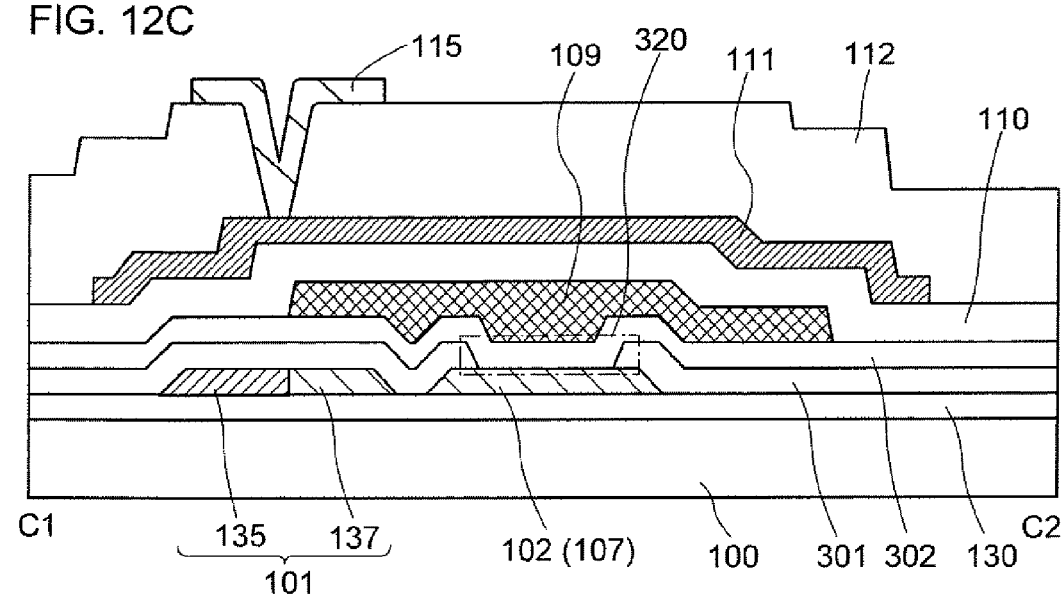

FIG. 11 is a plan view illustrating an example of a structure of the memory device of this embodiment, and FIGS. 12A to 12C are cross-sectional views taken along lines A1-A2, B1-B2 and C1-C2 of FIG. 11, respectively. As illustrated in FIG. 11 and FIG. 12A, the opening 320 is formed in a part of the insulating film 301, which overlaps the first impurity regions 103 and 104, the second impurity regions 105 and 106, and the channel formation region 107 that are formed in the island-shaped semiconductor region 102. By forming the opening 320, the insulating film between the channel formation region 107 and the conductive film 109 includes only the insulating film 302 in the channel length direction (the direction parallel to line A1-A2), and is reduced in thickness. On the other hand, in the channel width direction (the direction parallel to line C1-C2), the center of the insulating film between the channel formation region 107 and the conductive film 109 includes only the insulating film 302 and is reduced in thickness, and both ends thereof include the insulating film 301 and the insulating film 302 to be thick.

The memory device of this embodiment is different from that of Embodiment 1 in that the insulating film 301 having the opening 310 (or the opening 320) and the insulating film 302 are stacked between the island-shaped semiconductor region 101 and the floating gate so that the thickness of the insulating film between the island-shaped semiconductor region 102 and the floating gate is partially reduced.

Accordingly, depending on the thickness of the insulating film 301 and the insulating film 302, in the formula (3), the capacitance $C_1$ between the island-shaped semiconductor region 102 and the floating gate (the conductive film 109) decreases and the coupling ratio increases in this embodiment as compared with in Embodiment 1. Meanwhile, the capacitance $C_{21}$ between the back control gate (the island-shaped semiconductor region 101) and the floating gate (the conductive film 109) decreases and the coupling ratio increases. Thus, the coupling ratio $(C_{21}+C_{22})/(C_1+C_{21}+C_{22})$ in the formula (3) is equal to or less than that in Embodiment 1 in some cases.

Even in that case, this embodiment has the following new effects. In the memory element of this embodiment, the thickness of the insulating film between the back control gate and the floating gate can be easily increased more than that in Embodiment 1. An increase in the thickness of the insulating film contributes to suppression of the leakage of charge from the floating gate, resulting in improved charge retention characteristics of the memory element. In addition, the insulating film is less likely to deteriorate in a region where the insulating film 301 and the insulating film 302 are stacked over the island-shaped semiconductor region 102. Therefore, it is possible to suppress deterioration of the characteristics of the memory element due to repetition of a writing operation and an erasing operation, which allows the memory element to be more resistant to rewriting.

Embodiment 3

In this embodiment, a non-volatile semiconductor memory device different from that of Embodiment 1, which is a modified example of Embodiment 2, will be described. The memory device of this embodiment includes a memory element in which an insulating film between the island-shaped semiconductor region 101 and the floating gate is partially different in thickness. This embodiment will be described with reference to FIG. 13 and FIGS. 14A to 14C. Note that the description on the structure similar to those of Embodiments 1 and 2 is omitted.

Figure 13:
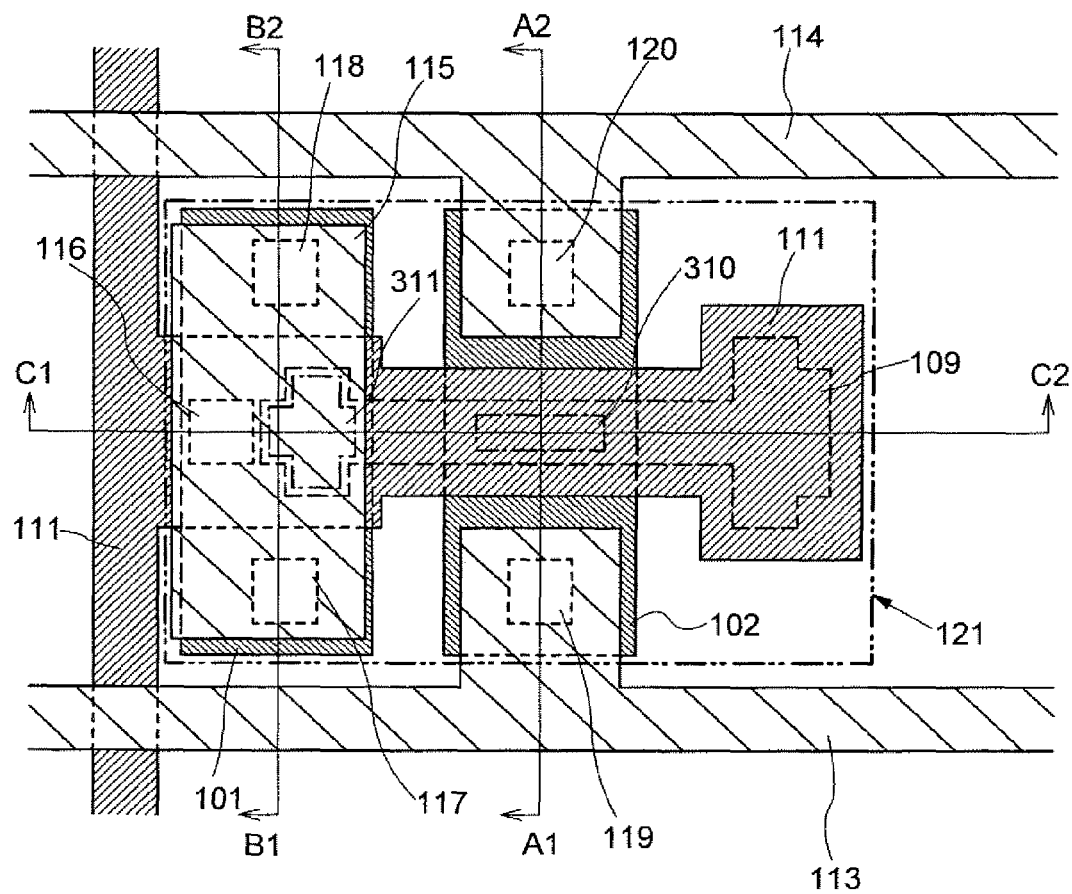
FIG. 13 is a plan view illustrating an example of a structure of a memory cell of a non-volatile semiconductor memory device in accordance with one embodiment of the present invention.
Figure 14A:
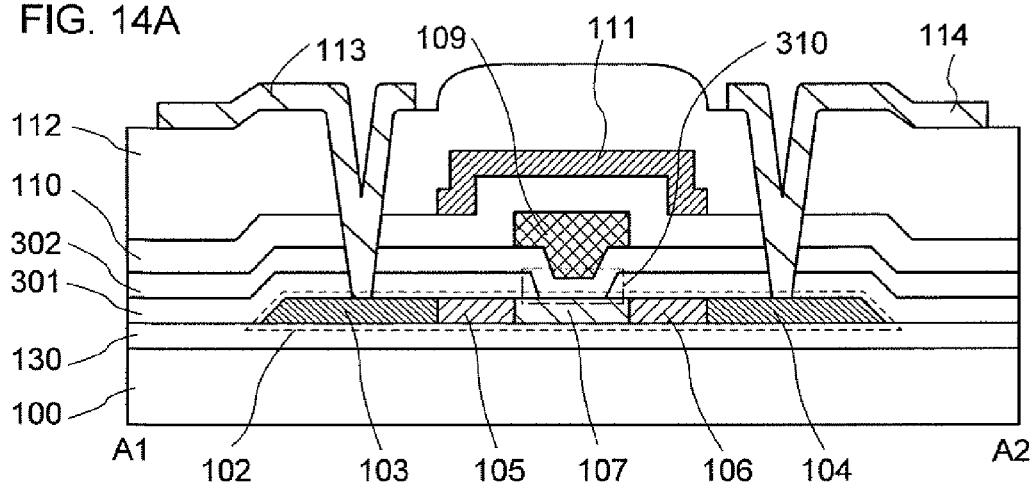
FIGS. 14A to 14C are cross-sectional views taken along lines A1-A2, B1-B2 and C1-C2 of FIG. 13, respectively.
Figure 14B:
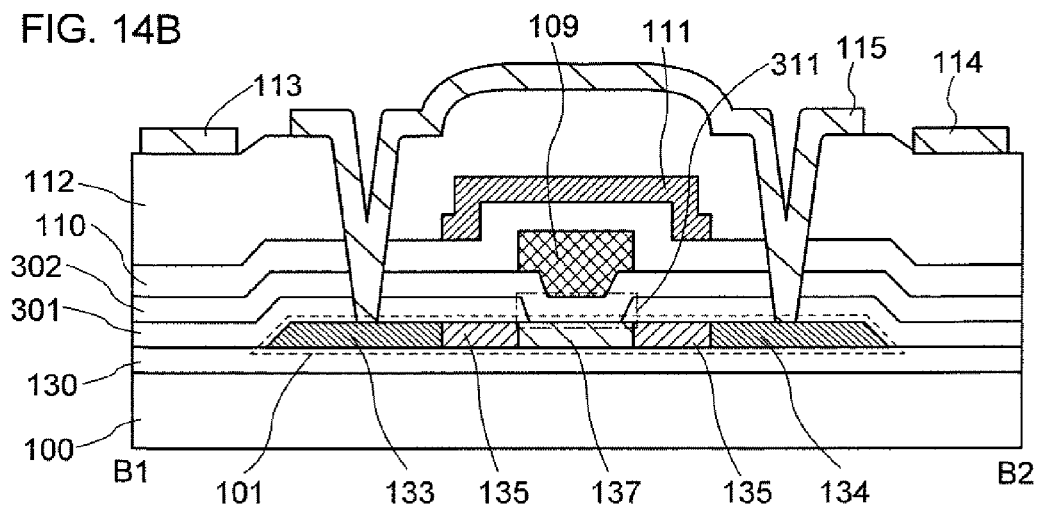
Figure 14C:
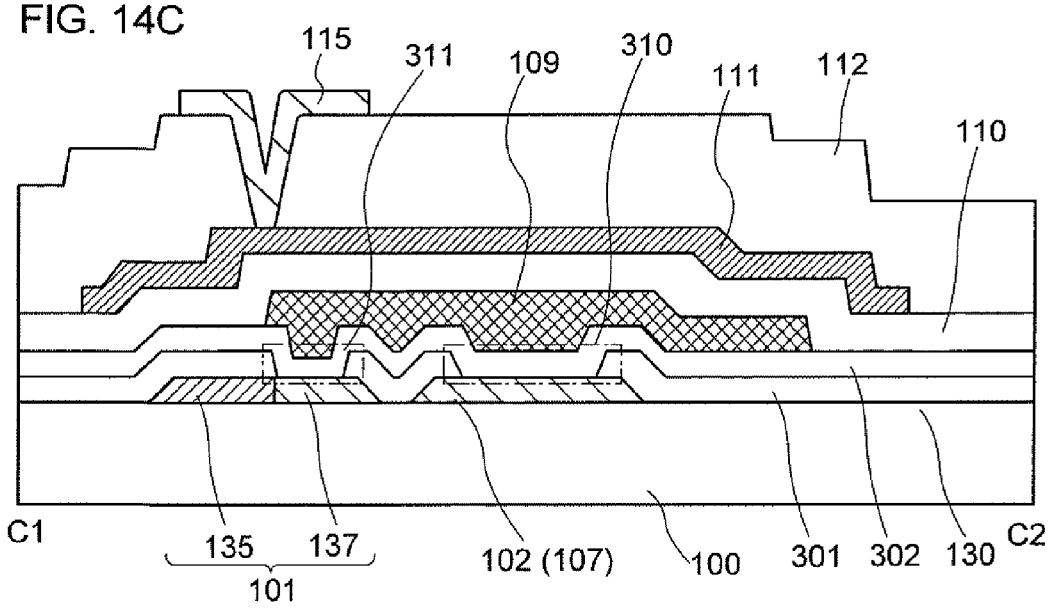

FIG. 13 is a plan view of a memory cell of the memory device of this embodiment, and FIGS. 14A to 14C are cross-sectional views taken along lines A1-A2, B1-B2 and C1-C2 of FIG. 13, respectively.

First, as described in Embodiment 2, the island-shaped semiconductor regions 101 and 102 are formed over the substrate 100 with the insulating film 130 interposed therebetween. Then, the insulating film 301 having a single-layer structure or a multi-layer structure is formed to cover the island-shaped semiconductor regions 101 and 102.

Then, the insulating film 301 is selectively removed by etching, whereby the opening 310 and an opening 311 are formed. The opening 311 is formed in part of a region where the island-shaped semiconductor region 101 overlaps the conductive film 109. In other words, the opening 311 is formed in a part of the insulating film 301, which overlaps the channel formation region 137. Note that in a part of the insulating film 301, which overlaps the island-shaped semiconductor region 102, the opening 320 may be formed instead of the opening 310 so as to include a region that does not overlap the conductive film 109 and the conductive film 111 as illustrated in FIG. 11 and FIG. 12A. The opening is not necessarily formed in the part of the insulating film 301, which overlaps the island-shaped semiconductor region 102. The following steps can be performed in a manner similar to those of Embodiment 1, and the memory device of this embodiment can be manufactured.

Similarly to in Embodiment 1, a back control gate (BCG) is provided in the memory device of this embodiment. Therefore, the coupling ratio is increased and a writing voltage and an erasing voltage can be reduced without increasing the area of the memory cell, resulting in lower power consumption of the memory device.

Furthermore, it is possible to reduce the area of the memory cell, which is necessary for achieving a desired coupling ratio. That is, the area of the memory cell can be reduced without increasing a writing voltage and an erasing voltage, which makes it easier for the memory cell to be highly integrated.

Similarly to in Embodiment 2, in the memory element of this embodiment, the thickness of the insulating film between the back control gate and the floating gate can be easily increased more than that in Embodiment 1. An increase in the thickness of the insulating film contributes to suppression of the leakage of charge from the floating gate, resulting in improved charge retention characteristics of the memory element. In addition, the insulating film is resistant to deterioration in a region where the insulating film 301 and the insulating film 302 are stacked over the island-shaped semiconductor region 102. Therefore, it is possible to suppress deterioration of the characteristics of the memory element due to repetition of a writing operation and an erasing operation, which allows the memory element to be more resistant to rewriting.

This embodiment is different from Embodiment 2 in that the opening 311 is formed in the part of the insulating film 301, which overlaps the island-shaped semiconductor region 101 and the conductive film 109, so that the thickness of the insulating film between the back control gate and the floating gate is partially reduced. Since a reduction in the thickness of the insulating film contributes to an increase in coupling ratio, the coupling ratio can be increased more in this embodiment than in Embodiment 2.

The non-volatile semiconductor memory device described in Embodiments 1 to 3 can be used as a memory medium in which data can be electrically stored and the stored data can be rewritten. Therefore, the non-volatile semiconductor memory device described in each of the embodiments can be applied to electronic devices of all fields. As the electronic devices, for example, there are photographic devices (such as video cameras and digital cameras), display devices (such as liquid crystal display devices and electroluminescence display devices), navigation systems, sound reproducing devices (such as car audio systems and audio components), computers, game machines, portable information terminals (mobile computers, cellular phones, portable game machines, and e-book readers), image reproducing devices, recording devices, IC chips, and RFIDs.

Example 1

Figure 16A:
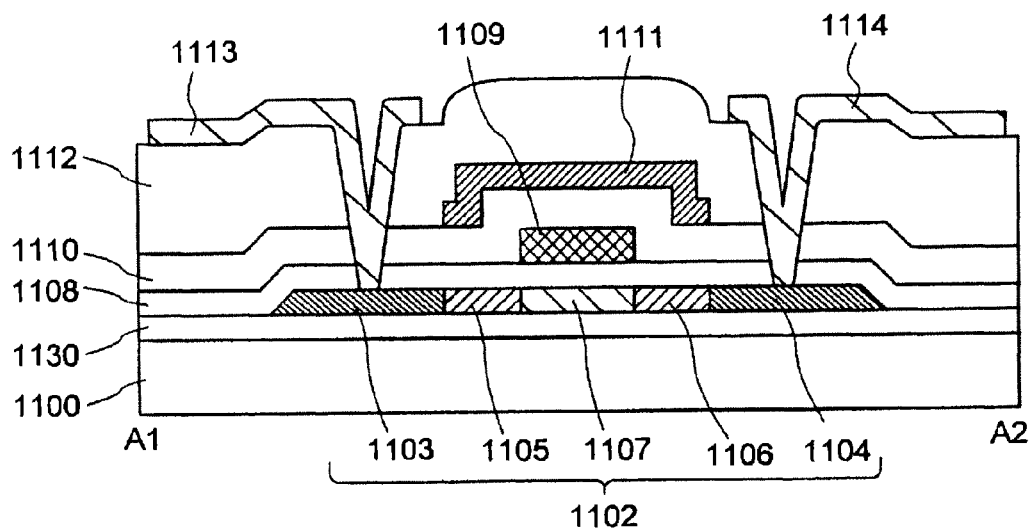
FIGS. 16A and 16B are cross-sectional views taken along lines A1-A2 and B1-B2 of FIG. 15, respectively.
Figure 16B:
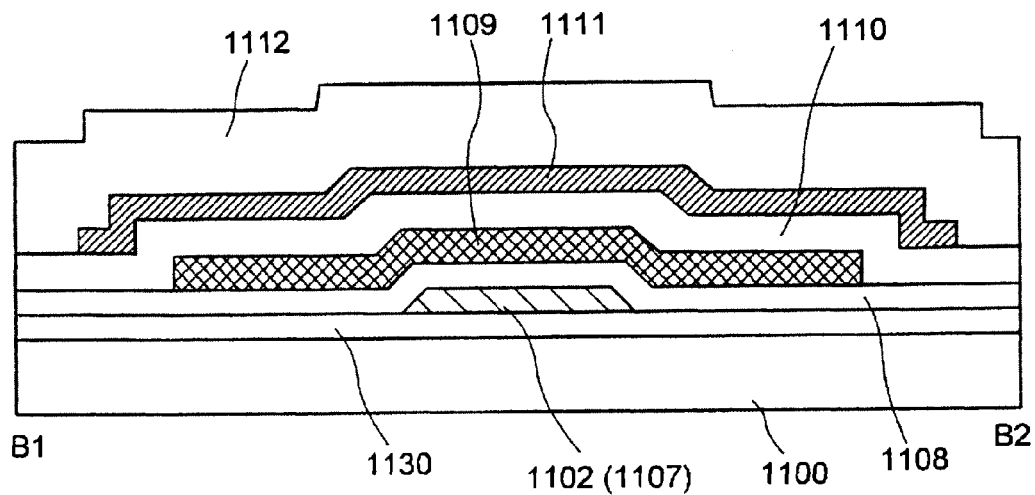

In this example, the memory cell of an embodiment of the present invention and the conventional memory cell illustrated in FIG. 15 and FIGS. 16A and 16B are manufactured and the characteristics thereof are compared. As the memory cell of an embodiment of the present invention, the memory cell of Embodiment 1 (here, referred to as "memory cell A") was manufactured. First, a method for manufacturing the memory cell A will be described.

A glass substrate was used as the substrate 100. As the insulating film 130, a silicon nitride oxide ($SiN_xO_y$, x>y>0) film with a thickness of 50 nm and a silicon oxynitride ($SiO_xN_y$, x>y>0) film with a thickness of 100 nm were formed by CVD over the glass substrate (the substrate 100) (see FIGS. 6A to 6C).

The island-shaped semiconductor regions 101 and 102 were formed of polycrystalline silicon. The polycrystalline silicon film was formed in the following manner. First, an amorphous silicon film with a thickness of 66 nm was formed by a plasma CVD apparatus using hydrogen and monosilane as source gases. Then, heat treatment was performed at 500° C. for one hour and at 550° C. for four hours, whereby hydrogen was released from the amorphous silicon film. Next, the amorphous silicon film was irradiated with a beam of the second harmonic (wavelength of 532 nm) of a $YVO_4$ laser, thereby being crystallized to form a polycrystalline silicon film. The $YVO_4$ laser was a semiconductor laser (LD) pumped continuous wave laser. Then, the polycrystalline silicon film was processed into a desired shape by etching, whereby the island-shaped semiconductor regions 101 and 102 were formed over the insulating film 130 (see FIG. 5 and FIGS. 6A to 6C).

In order to form the insulating film 108, first, high-density plasma oxidation was performed on the island-shaped semiconductor regions 101 and 102. Then, a silicon oxynitride film with a thickness of 9 nm was formed by a plasma CVD apparatus using a monosilane ($SiH_4$) gas and a dinitrogen monoxide ($N_2O$) gas as source gases. The mass flow ratio of the source gases was $SiH_4:N_2O=1:800$, and plasma excitation was performed under the following conditions: the high-frequency power was 150 W (a frequency of 60 MHz); the deposition temperature (substrate temperature), 400° C.; the pressure in the chamber, 40 Pa; and the electrode interval, 28 mm. After the silicon oxynitride film was formed, high-density plasma oxidation was performed again. Through the above steps, the insulating film 108 was formed. Next a tungsten film with a thickness of 30 nm was formed over the insulating film 108 by a sputtering apparatus. The tungsten film was processed into a predetermined shape by etching, whereby the conductive film 109 was formed. Then, phosphorus (P) was added to the island-shaped semiconductor regions 101 and 102 by a plasma doping apparatus, whereby the impurity regions 205, 206 and 235 were formed. As the source gas, $PH_3$ diluted with hydrogen was used (see FIG. 5 and FIGS. 6A to 6C).

Next, the insulating film 110 was formed to cover the conductive film 109. Here, a silicon oxynitride film with a thickness of 50 nm was formed by a plasma CVD apparatus. A tantalum nitride film with a thickness of 20 nm and a tungsten film with a thickness of 370 nm were stacked over the insulating film 110 by a sputtering apparatus. This stacked film was etched to form the conductive film 111. Then, phosphorus was added to the island-shaped semiconductor regions 101 and 102 by a plasma doping apparatus using the conductive film 111 as a mask. As the source gas, $PH_3$ diluted with hydrogen was used. Through the above steps, the first impurity regions 103 and 104 and the second impurity regions 105 and 106 were formed in the island-shaped semiconductor region 101, and the first impurity regions 133 and 134 and the second impurity region 135 were formed in the island-shaped semiconductor region 102 (see FIG. 7 and FIGS. 8A to 8C).

Then, a silicon oxynitride film with a thickness of 100 nm and a silicon oxide film with a thickness of 600 nm were stacked as the insulating film 112 to cover the conductive film 111. After the silicon oxide film was formed, heat treatment was performed at 550° C. in a nitrogen atmosphere, thereby activating phosphorus that had been added to the island-shaped semiconductor regions 101 and 102. Then, the stack of the insulating films 108, 110 and 112 was etched, whereby the openings 116 to 120 were formed. Next, a conductive film having a multi-layer structure including a titanium film with a thickness of 60 nm, a titanium nitride film with a thickness of 40 nm, a pure aluminum film with a thickness of 500 nm, and a titanium film with a thickness of 100 nm was formed over the insulating film 112 by a sputtering apparatus. This stacked film was processed into a desired shape by etching, whereby the conductive films 113 to 115 were formed. Through the above steps, the memory cell A was manufactured (see FIG. 1 and FIGS. 2A to 2C).

In this example, two kinds of memory cells x and y were formed as comparative examples. The memory cells x and y each have the same structure as the conventional memory cell illustrated in FIG. 15. The memory cells x and y each were manufactured under the same conditions as the memory cell A except that the island-shaped semiconductor region 101 forming the back control gate, and the conductive film 115 were not formed.

The memory cells A, x and y differ in the ratio of the area where the island-shaped silicon film (the island-shaped semiconductor region 102) of the memory transistor overlaps the floating gate (the conductive film 109) to the area where the floating gate overlaps the control gate (the conductive film 111), and the existence of the back control gate (the island-shaped semiconductor region 101). These conditions determine the coupling ratio. Table 1 shows the difference in structure between the memory cells A, x and y, and the writing voltage and the erasing voltage of the memory cells A, x and y.

TABLE 1

|  | present example | comparative example | |
|---|---|---|---|
|  | memory cell A | memory cell x | memory cell y |
| Si-FG:FG-CG:FG-BCG (area ratio) | 1:4:1 | 1:8:0 | 1:4:0 |
| back control gate | yes | no | |
| writing voltage | 13.6 V | 14.2 V | 17.7 V |
| erasing voltage | −14.8 V | −15.4 V | −21.1 V |

Both the writing operation and the erasing operation were performed by an F-N (Fowler-Nordheim) tunneling current. The writing voltage and the erasing voltage of each of the memory cells A, x and y were measured with a reading voltage set to 3 V, the threshold voltage of the memory transistor in a written state set to 4.3 V, and the threshold voltage of the memory transistor in an erased state set to 1.3 V.

In Table 1, Si—FG represents the area where the island-shaped semiconductor region 102 of the memory transistor overlaps the conductive film 109, FG-CG represents the area where the conductive film 109 overlaps the conductive film 111, and FG-BCG represents the area where the conductive film 109 overlaps the island-shaped semiconductor region 101 forming the back control gate. The ratio of these areas is shown in Table 1.

Here, the layout of the memory cell x corresponds to FIG. 15. The island-shaped semiconductor region 102 of the memory cell A and the island-shaped semiconductor region 1102 of the memory cell x have the same shape and size. The memory cell A and the memory cell x were manufactured to have the area Si—FG with the same size. In the memory cell x, the conductive film 1109 forming the floating gate and the conductive film 1111 forming the control gate are larger than the conductive film 109 and the conductive film 111 of the memory cell A, respectively, and FG-CG of the memory cell x is twice as large as that of the memory cell A. The area of the memory cell A is approximately 13% smaller than that of the memory cell x.

The memory cell y has a structure in which the island-shaped semiconductor region 101 and the conductive film 115 are removed from the memory cell A. The area Si—FG and the area FG-CG of the memory cell y are the same as those of the memory cell A.

The writing voltage and the erasing voltage of the memory cell A are equal to those of the memory cell x if the values of Table 1 are rounded to the nearest whole number. On the other hand, the area of the memory cell A is as much as approximately 13% smaller than that of the memory cell x. This shows that the back control gate provided in the memory transistor allows the area of the memory cell to be reduced without increasing a writing voltage and an erasing voltage. Note that in the memory cell A of this example, the island-shaped semiconductor region 102 was formed to overlap only a small part of the conductive film 109. However, the structure of the memory cell A is only an example of the present invention, and the back control gate (the island-shaped semiconductor region 101) can be provided in almost all the region 121 overlapping the conductive film 109 except in a region where the island-shaped semiconductor region 102 is formed and in an element separation region. It is needless to say that the effect of this example is enhanced by employing such a structure. Thus, the structure of the memory cell of this example was found to be quite useful for higher integration of memory cells.

In addition, Table 1 shows that the writing voltage and the erasing voltage can be reduced by providing the back control gate. Comparing the memory cell A and the memory cell y, the area ratio Si—FG:FG-CG is equal to each other; however, the writing voltage and the erasing voltage of the memory cell A are smaller than those of the memory cell y. This shows that the back control gate provided in the memory transistor allows the writing voltage and the erasing voltage to be reduced without increasing the area of the memory cell. Thus, the structure of this example was found to be quite useful in reducing the power consumption of the memory cell.

This application is based on Japanese Patent Application serial No. 2008-123583 filed with Japan Patent Office on May 9, 2008, the entire contents of which are hereby incorporated by reference.

EXPLANATION OF REFERENCE 40. non-volatile semiconductor memory device, 51. memory cell array, 52. driver circuit portion, 60. control circuit, 61. row decoder, 62. column decoder, 63. address buffer, 64. step-up circuit, 65. sense amplifier, 66. data buffer, 67. data input-output buffer, 70. memory cell, 100. substrate, 101. island-shaped semiconductor region, 102. island-shaped semiconductor region, 103. first impurity region, 104. first impurity region, 105. second impurity region, 106. second impurity region, 107. channel formation region, 108. insulating film, 109. conductive film, 110. insulating film, 111. conductive film, 112. insulating film, 113. conductive film, 114. conductive film, 115. conductive film, 116. opening, 117. opening, 119. opening, 121. region, 130. insulating film, 133. first impurity region, 134. first impurity region, 135. second impurity region, 137. channel formation region, 205. impurity region, 206. impurity region, 235. impurity region, 301. insulating film, 302. insulating film, 310. opening, 311. opening, 320. opening, 1100. substrate, 1102. island-shaped semiconductor region, 1103. first impurity region, 1104. first impurity region, 1105. second impurity region, 1106. second impurity region, 1107. channel formation region, 1108. insulating film, 1109. conductive film, 1110. insulating film, 1111. conductive film, 1112. insulating film, 1113. conductive film, 1114. conductive film, 1119. opening, 1120. opening, 1121. region, 1130. insulating film

The invention claimed is:

1. A non-volatile semiconductor memory device comprising a plurality of memory cells, each of the memory cells comprising:
a first island-shaped semiconductor region over an insulating surface and containing a channel formation region and a pair of impurity regions;
a second island-shaped semiconductor region over the insulating surface;
a first insulating film over the first island-shaped semiconductor region and the second island-shaped semiconductor region;
a floating gate over the first insulating film, wherein the floating gate overlaps the first island-shaped semiconductor region and the second island-shaped semiconductor region;
a second insulating film over the floating gate;
a control gate over the second insulating film; and
a conductive film over the control gate, wherein the conductive film is in direct contact with both of the control gate and the second island-shaped semiconductor region.

2. The non-volatile semiconductor memory device according to claim 1, wherein a thickness of a part of the first insulating film which overlaps the first island-shaped semiconductor region, is selectively reduced.

3. The non-volatile semiconductor memory device according to claim 1, wherein a thickness of a part of the first insulating film which overlaps the second island-shaped semiconductor region, is selectively reduced.

4. The non-volatile semiconductor memory device according to claim 1, wherein the first island-shaped semiconductor region contains one selected from the group consisting of a single crystal silicon film, a polycrystalline silicon film, and a microcrystalline silicon film.

5. The non-volatile semiconductor memory device according to claim 1, wherein the second island-shaped semiconductor region contains one selected from the group consisting of a single crystal silicon film, a polycrystalline silicon film, and a microcrystalline silicon film.

6. The non-volatile semiconductor memory device according to claim 1, wherein the control gate covers top and side surfaces of the floating gate with the second insulating film interposed therebetween.

7. A non-volatile semiconductor memory device comprising a plurality of memory cells, each of the memory cells comprising:
a first island-shaped semiconductor region over an insulating surface and containing a channel formation region and a pair of impurity regions;
a second island-shaped semiconductor region over the insulating surface;
a first insulating film over the first island-shaped semiconductor region and the second island-shaped semiconductor region;
a second insulating film over the first insulating film;
a floating gate over the second insulating film, wherein the floating gate overlaps the first island-shaped semiconductor region and the second island-shaped semiconductor region;
a third insulating film over the floating gate;
a control gate over the third insulating film; and
a conductive film over the control gate, wherein the conductive film is in direct contact with both of the control gate and the second island-shaped semiconductor region, and
wherein the first insulating film has an opening at a portion overlapping the first island-shaped semiconductor region.

8. The non-volatile semiconductor memory device according to claim 7, wherein the first insulating film has another opening at a portion overlapping the second island-shaped semiconductor region.

9. The non-volatile semiconductor memory device according to claim 7, wherein the first island-shaped semiconductor region contains one selected from the group consisting of a single crystal silicon film, a polycrystalline silicon film, and a microcrystalline silicon film.

10. The non-volatile semiconductor memory device according to claim 7, wherein the second island-shaped semiconductor region contains one selected from the group consisting of a single crystal silicon film, a polycrystalline silicon film, and a microcrystalline silicon film.

11. The non-volatile semiconductor memory device according to claim 7, wherein the control gate covers top and side surfaces of the floating gate with the third insulating film interposed therebetween.

12. The non-volatile semiconductor memory device according to claim 7,
wherein the plurality of memory cells are formed over a substrate, and
wherein the substrate contains one selected from the group consisting of a glass substrate, a quartz substrate and a resin substrate.

* * * * *